United States Patent
Furukawa et al.

(10) Patent No.: US 9,879,126 B2
(45) Date of Patent: Jan. 30, 2018

(54) CURABLE ORGANOPOLYSILOXANE COMPOSITION FOR TRANSDUCERS AND APPLICATIONS OF SUCH CURABLE SILICONE COMPOSITION FOR TRANSDUCERS

(71) Applicants: Dow Corning Corporation, Midland, MI (US); Dow Corning Toray Co., Ltd., Tokyo (JP)

(72) Inventors: Haruhiko Furukawa, Ichihara (JP); Peter Cheshire Hupfield, Trevaughan Dyfed (GB); Hong Sub Kim, Cupertino, CA (US); Eiji Kitaura, Ichihara (JP); Kent R. Larson, Midland, MI (US); Wataru Nishiumi, Ichihara (JP); Takuya Ogawa, Ichihara (JP); Kouichi Ozaki, Ichihara (JP); Son Thanh Phan, Ichihara (JP); Keiji Wakita, Ichihara (JP)

(73) Assignees: DOW CORNING CORPORATION, Midland, MI (US); DOW CORNING TORAY CO., LTD., Tokyo (JP)

( * ) Notice: Subject to any disclaimer, the term of this patent is extended or adjusted under 35 U.S.C. 154(b) by 373 days.

(21) Appl. No.: 14/655,785

(22) PCT Filed: Dec. 26, 2013

(86) PCT No.: PCT/US2013/077820
§ 371 (c)(1),
(2) Date: Jun. 26, 2015

(87) PCT Pub. No.: WO2014/105959
PCT Pub. Date: Jul. 3, 2014

(65) Prior Publication Data
US 2015/0344671 A1 Dec. 3, 2015

Related U.S. Application Data

(60) Provisional application No. 61/746,589, filed on Dec. 28, 2012.

(51) Int. Cl.
*C08K 5/5419* (2006.01)
*C08K 9/06* (2006.01)
(Continued)

(52) U.S. Cl.
CPC .......... *C08K 5/5419* (2013.01); *C08K 5/5475* (2013.01); *C08K 9/06* (2013.01);
(Continued)

(58) Field of Classification Search
CPC ...... C08K 5/5419; C08K 5/5475; C08K 9/06; C08L 83/08; H01L 41/083; H01L 41/193; H01L 41/45
(Continued)

(56) References Cited

U.S. PATENT DOCUMENTS 4,032,502 A 6/1977 Lee et al.
7,521,124 B2 * 4/2009 Ahn ................. C08L 83/04
156/329
(Continued)

FOREIGN PATENT DOCUMENTS

CN 102532915 A 7/2012
DE 26 45 614 A1 4/1977
(Continued)

OTHER PUBLICATIONS

International Search Report for Application No. PCT/US2013/077830 dated Mar. 27, 2014, 3 pages.
(Continued)

*Primary Examiner* — Thomas Dougherty
(74) *Attorney, Agent, or Firm* — Howard & Howard Attorneys PLLC

(57) ABSTRACT

The present invention provides a curable organopolysiloxane composition capable of producing a cured article that
(Continued)

Figure 1:
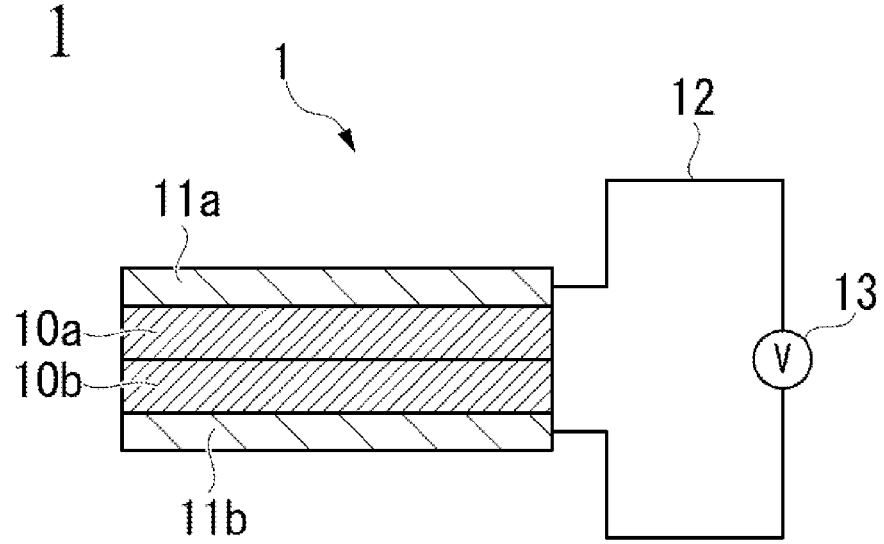

can be used as a transducer and provided with excellent mechanical characteristics and/or electrical characteristics. The present invention also relates to a novel curable organopolysiloxane composition for transducer use comprising a curable organopolysiloxane composition and a compound having a highly dielectric functional group.

19 Claims, 3 Drawing Sheets

(51) Int. Cl.
| | |
|---|---|
| C08K 5/5475 | (2006.01) |
| H01L 41/083 | (2006.01) |
| C08L 83/08 | (2006.01) |
| H01L 41/45 | (2013.01) |
| H01L 41/193 | (2006.01) |
| C08G 77/22 | (2006.01) |

(52) U.S. Cl.
CPC ............ *C08L 83/08* (2013.01); *H01L 41/083* (2013.01); *H01L 41/193* (2013.01); *H01L 41/45* (2013.01); *C08G 77/22* (2013.01)

(58) Field of Classification Search
USPC .................... 310/311, 328, 358, 365, 800
See application file for complete search history.

(56) References Cited

U.S. PATENT DOCUMENTS

| | | | |
|---|---|---|---|
| 8,368,284 B2 | 2/2013 | Takeuchi et al. | |
| 8,373,286 B2 | 2/2013 | Yoshitake et al. | |
| 8,614,282 B2 | 12/2013 | Hamamoto et al. | |
| 9,496,468 B2 | 11/2016 | Kokubo et al. | |
| 2003/0035948 A1* | 2/2003 | Fujimaru | B32B 15/04 428/343 |
| 2007/0295390 A1 | 12/2007 | Sheats et al. | |
| 2010/0255319 A1 | 10/2010 | Paul | |
| 2011/0186792 A1 | 8/2011 | Hirano | |
| 2011/0313122 A1 | 12/2011 | Matsutani et al. | |

FOREIGN PATENT DOCUMENTS

| | | |
|---|---|---|
| EP | 0 202 108 A2 | 11/1986 |
| EP | 0 798 344 A2 | 10/1997 |
| EP | 2 228 408 A1 | 9/2010 |
| JP | H05-20924 A | 1/1993 |
| JP | 2004-137475 A | 5/2004 |
| JP | 2009227985 A | 10/2009 |
| JP | 201068667 A | 3/2010 |
| TW | 201014885 A | 4/2010 |
| WO | WO 2006/121818 A2 | 11/2006 |
| WO | 2011125753 A1 | 10/2011 |
| WO | WO 2012/032437 A1 | 3/2012 |
| WO | WO 2014/105965 A1 | 7/2014 |

OTHER PUBLICATIONS

International Search Report for Application No. PCT/US2013/077820 dated Apr. 14, 2014, 7 pages.

Bejenariu, Anca G. et al., "New Elastomeric Silicone Based Networks Applicable as Electroactive Systems," Proc. of SPIE, vol. 7976, pp. 79762V-1 to 79762V-8, Jul. 2011.

Kussmaul, B. et al., "Improved Dielectric Elastomer Actuator (DEA) Materials by Chemical Modification of Silicone Networks on Molecular Level," Actuator 2012, 13th International Conference on New Actuators, Bremen, Germany, Jun. 18-20, 2012, pp. 374-378.

English language abstract not found for DE 26 45 614; however, see English language equivalent U.S. Pat. No. 4,032,502. Original document extracted from espacenet.com database on Jul. 15, 2015, 44 pages.

English language abstract for JP 2004-137475 extracted from espacenet.com database on Jul. 15, 2015, 2 pages.

English language abstract for CN 102532915 extracted from espacenet.com database on Apr. 19, 2017, 1 page.

English language abstract for TW 201014885 extracted from espacenet.com database on Apr. 19, 2017, 2 pages.

English language abstract and machine-assisted English translation for JPH 05-20924 extracted from espacenet.com database on Nov. 2, 2017, 11 pages.

English language abstract and machine-assisted English translation for JP 2009-227985 extracted from espacenet.com database on Nov. 2, 2017, 21 pages.

English language abstract for JP 2010-068667 extracted from espacenet.com database on Nov. 2, 2017, 1 page.

English language abstract for WO 2011/125753 extracted from espacenet.com database on Nov. 2, 2017, 2 pages.

* cited by examiner

CURABLE ORGANOPOLYSILOXANE COMPOSITION FOR TRANSDUCERS AND APPLICATIONS OF SUCH CURABLE SILICONE COMPOSITION FOR TRANSDUCERS

CROSS-REFERENCE TO RELATED APPLICATIONS

This application is the National Stage of International Patent Application No. PCT/US2013/077820, filed on Dec. 26, 2013, which claims priority to and all the advantages of U.S. Patent Application No. 61/746,589, filed on Dec. 28, 2012, the content of which is incorporated herein by reference.

TECHNICAL FIELD

The present invention relates to a curable organopolysiloxane composition capable of use with advantage for transducers. The present invention provides a curable organopolysiloxane composition for which the organopolysiloxane cured article formed by curing is used as an electrically active silicone elastomer material capable of use as the dielectric layer or electrode layer of a transducer. The present invention particularly relates to a curable organopolysiloxane composition having electrical characteristics and mechanical characteristics suitable for a material used as a dielectric material, and, further, particularly for use as a dielectric layer of a transducer. The present invention further relates to a production method for an electrically active polymer material formed using a curable organopolysiloxane composition, and to a component of a transducer containing this electrically active polymer material.

BACKGROUND ART

A. G. Benjanariu, et. al., indicated that dielectric polymers are potential materials for artificial muscles (A. G. Benjanariu, et. al., "New elastomeric silicone based networks applicable as electroactive systems," Proc. of SPIE vol. 7976 79762V-1 to 79762V-8 (2011)). Here, they showed the physical characteristics of a material having a unimodal or bimodal network formed with an addition-curable silicone rubber. To form this silicone rubber, a linear chain poly (dimethylsiloxane) (PDMS) polymer having vinyl groups is crosslinked using a short chain organohydrogensiloxane having 4 silicon-bonded hydrogen atoms as the crosslinking agent. Moreover, in B. Kussmaul et al., Actuator 2012, 13th International Conference on New Actuators, Bremen, Germany, 18-20 Jun. 2012, pp. 374 to 378, there is mention of an actuator that sandwiches a dielectric elastomer material, which is an organopolydimethylsiloxane that has been chemically modified by groups functioning as electrical dipoles, between electrodes, the modification being performed by bonding the groups to polydimethylsiloxane using a crosslinking agent.

However, no specific composition is disclosed for the curable organopolysiloxane composition in either of the aforementioned references, and furthermore, in practice the physical properties of the curable organopolysiloxane compositions are insufficient for materials for industrial use in various types of transducers. Thus an electrically active polymer material is needed that combines mechanical characteristics and electrical characteristics capable of being satisfactory in actual use as a material for various types of transducers. In particular, there is strong need for a curable organopolysiloxane composition that cures and provides an electrically active polymer having excellent physical characteristics.

BACKGROUND DOCUMENTS

Nonpatent Document 1: "New elastomeric silicone based networks applicable as electroactive systems," Proc. of SPIE vol. 7976 79762V-1 to 79762V-8 (2011)
Nonpatent Document 2: Actuator 2012, 13th International Conference on New Actuators, Bremen, Germany, 18-20 Jun. 2012, pp. 374 to 378

Technical Problem

An object of the present invention is to provide a curable organopolysiloxane composition capable of producing a cured article that can be used as a transducer and provided with excellent mechanical characteristics and/or electrical characteristics.

Another object of the present invention is to provide a curable organopolysiloxane composition capable of realizing a high energy density by providing excellent mechanical characteristics and/or electrical characteristics, and particularly a high specific dielectric constant, high dielectric breakdown strength, and low Young's modulus; able to achieve durability and a practical displacement amount due to excellent mechanical strength (i.e. tensile strength, tearing strength, elongation, or the like) in the case of use as a dielectric layer of a transducer; and able to produce a cured article capable of use as a material for use in transducers. Furthermore, various types of fillers (including fillers that have been surface treated) may be blended with the curable organopolysiloxane composition of the present invention in order to attain desired electrical characteristics, and the curable organopolysiloxane composition of the present invention may comprise a mold release additive in order to prevent breakage when molded into a thin sheet, and also may comprise an additive for improvement of insulation breakdown characteristics.

Other objects of the present invention are to provide a production method for the aforementioned curable organopolysiloxane composition, to provide a curable silicone elastomer material capable of use as an electrically active polymer material for use in transducers, to provide a method of production for such a curable silicone elastomer material, and to provide various types of transducers using the curable silicone elastomer material.

Solution to Problem

The present invention was achieved by the discovery by the inventors that the present invention can solve the aforementioned problems by the below described means.

The aforementioned problems are solved by:

[1] A curable organopolysiloxane composition for transducer use, comprising a silicon compound (Z) having a highly dielectric functional group and a curable organopolysiloxane composition (A+B).

[2] A curable organopolysiloxane composition for transducer use, comprising an organic compound (Z1) having at least one curable functional group and a highly dielectric functional group and a curable organopolysiloxane composition (A+B).

[3] A curable organopolysiloxane composition for transducer use, comprising an organic compound (Z2) having a highly dielectric functional group and a curable organopolysiloxane composition (A+B), wherein the compound (Z2) is miscible with the composition (A+B).

[4] The curable organopolysiloxane composition for transducer use of any of [1] to [3], which is curable by condensation curing reaction, addition curing reaction, peroxide curing reaction, photo-curing reaction or drying with solvent removal.

[5] The curable organopolysiloxane composition for transducer use of any of [1] to [4], which provides a cured body having a structure that the highly dielectric functional group is bonded to silicon atom via a covalent bond.

[6] or [7] The curable organopolysiloxane composition for transducer use of any of [1] to [5], wherein the content of the highly dielectric functional group is in a range of 1 to 80 mass % (Preferably, in a range of 10 to 50 mass %) to the entire siloxane component of the curable organopolysiloxane composition.

[8] The curable organopolysiloxane composition for transducer use of any of [1] to [7], wherein the highly dielectric functional group is at least one selected from a) Halogen Atoms and Halogen Atom-containing Groups, b) Nitrogen Atom-containing Groups, c) Oxygen Atom-containing Groups, d) Heterocyclic Groups, e) Boron-containing Groups, f) Phosphorous-containing Groups, and g) Sulfur-containing Groups.

DETAILED DESCRIPTION OF THE INVENTION

The constituent requirements of the present invention will be explained below in detail. No particular limitation is placed on the curing system, and any curing reaction system may be employed for the curable organopolysiloxane composition of the present invention as far as initially uncured raw material, especially flowable raw material, may be formed into a cured production body. Generally, the curable organopolysiloxane composition of the present invention is cured by condensation curing system or addition curing system. However, peroxide curing (radical-induced curing) system or high energy ray (ex. ultraviolet ray) curing system may be employed and available for the curing system of the composition. Furthermore, the method of forming the cured body by forming a cross-linking structure in the solution state and drying with solvent removal may be employed.

Preferably, the curable organopolysiloxane composition comprises reactive organopolysiloxane and the composition satisfies the [Characteristic 1] through [Characteristic 3], and the optional [Characteristic 4] and [Characteristic 5].
[Reactive Organopolysiloxane]

The curable organopolysiloxane composition of the present invention comprises the reactive organopolysiloxane represented by general formula $M_a M^R_b D_c D^R_d T_e T^R_f Q_g$. In the aforementioned general formula, M represents a triorganosiloxy group, D represents a diorganosiloxy group, T represents a monoorganosiloxy group, and Q is a siloxy unit representing $SiO_{4/2}$. $M^R$, $D^R$, and $T^R$ are siloxy units in which one of the R substituting groups of the siloxy units represented by M, D, and T, respectively, is a substituting group capable of curing reaction in a condensation reaction, addition reaction, peroxide reaction, or photoreaction; although this group is preferably a group capable of addition reaction. Among these groups, in consideration of high reaction rate and low side reactions, the substituting group capable of curing reaction is preferably a group active in a hydrosilylation reaction, i.e. a silicon atom-bonded hydrogen atom or an aliphatic unsaturated bond-containing group (such as an alkenyl group of 2 to 20 carbon atoms, or the like). Moreover, the non-R substituting groups of the aforementioned reactive organopolysiloxane are preferably groups that do not participate in the addition reaction or are highly dielectric functional groups, as exemplified by alkyl groups such as the methyl group, ethyl group, propyl group, butyl group, hexyl group, or the like; aryl groups such as the phenyl group, o-tolyl group, p-tolyl group, naphthyl group, halogenated phenyl group, or the like; alkoxy groups; or the like. Among such groups, the methyl group is preferred from the standpoint of economics. Specific examples of the reactive organopolysiloxane include trimethylsiloxy group-doubly molecular chain terminated dimethylsiloxane-methylhydrogensiloxane copolymers, trimethylsiloxy group-doubly molecular chain terminated dimethylsiloxane-methylvinylsiloxane copolymers, dimethylhydrogensiloxy group-doubly molecular chain terminated dimethylsiloxane-methylhydrogensiloxane copolymers, dimethylvinylsiloxy group-doubly molecular chain terminated dimethylsiloxane-methylvinylsiloxane copolymers, methylsiloxane-dimethylsiloxane-methylhydrogensiloxane copolymers, methylsiloxane-dimethylsiloxane-methylvinylsiloxane copolymers, dimethylhydrogen functionalized MQ resins, dimethylvinyl functionalized MQ resins, or the like.

Number average molecular weight (Mw) of the aforementioned reactive organopolysiloxane is in the range of 300 to 10,000. Moreover, no particular limitation is placed on viscosity measured under 10 ($s^{-1}$) shear rate conditions at 25° C. using a rheometer equipped with a cone plate of 20 mm diameter, although this viscosity is preferably in the range of 1 to 10,000 mPa·s, and particularly preferably is in the range of 5 to 5,000 mPa·s.

[Characteristic 1]: Content of the Reactive Organopolysiloxane

When the proportion of the aforementioned reactive organopolysiloxane (formed such that the value of (a+c)/(b+d+e+f+g) is less than 3) relative to the entire amount of the siloxane component in the curable organopolysiloxane composition is less than 0.1% by weight, the number of crosslink points in the polysiloxane component is excessively low, and thus mechanical strength and dielectric breakdown strength after the curing reaction are insufficient. Conversely, a proportion in excess of 25% by weight is unsuitable since the number of crosslink points is excessive, and thus post-curing elasticity is high, and break elongation is low. This proportion is preferably less than or equal to 10% by weight.
[Characteristic 2]: Reactive Organopolysiloxane Having Groups Capable of Curing Reaction Only at Both Terminals of the Molecule The reactive organopolysiloxane having groups capable of curing reaction only at both molecular chain terminals will be explained next. Here, the term "curing reaction-capable group" means a group that is capable of use as a group in a condensation reaction, addition reaction, peroxide reaction, or photoreaction. However, for reasons similar to those described above, this group is preferably capable of an addition reaction. Among such addition reaction capable groups, the group is preferably active in a hydrosilylation reaction, i.e. is a group containing a silicon atom-bonded hydrogen atom or aliphatic unsaturated bond-containing group (such as an alkenyl group of 2 to 20 carbon atoms, or the like). Specific examples of the reactive organopolysiloxane include dimethylhydrogensiloxy group-doubly molecular chain terminated polydimethylsiloxane and dimethylvinylsiloxy group-doubly molecular chain terminated polydimethylsiloxane. For further suitability with respect to material characteristics (e.g. mechanical characteristics, dielectric characteristics, heat resistance characteristics, or the like), it is possible for part of the methyl groups of such polymers to be replaced by an ethyl group, propyl group, butyl group, hexyl group, or phenyl group.

Number average molecular weight (Mw) of the reactive organopolysiloxane having curing reaction-capable groups only at both molecular chain terminals is in the range of 300 to 100,000. Moreover, although no particular limitation is placed on viscosity measured under 10 (s$^{-1}$) shear rate conditions at 25° C. using a rheometer equipped with a cone plate of 20 mm diameter, this viscosity is preferably in the range of 1 to 100,000 mPa·s, and particularly preferably is in the range of 5 to 10,000 mPa·s.

A proportion of this reactive organopolysiloxane having curing reaction-capable groups only at both molecular chain terminals relative to the total siloxane component in the curable organopolysiloxane composition less than 75% by weight is inappropriate in that high elongation at break may not be achieved. Conversely, when this value exceeds 99.9% by weight, the proportion of the molecule involved in the crosslinking reaction becomes low, and post-curing mechanical strength and dielectric breakdown strength are insufficient. Thus a proportion in excess of 99.9% by weight is inappropriate.

[Characteristic 3]: Use of Two Types of Reactive Organopolysiloxanes (S) and (L)

Average molecular weight between these two groups capable of the curing reaction is less than 10,000 for the reactive organopolysiloxane (S), which is a reactive organopolysiloxane having at least two curing reaction-capable groups in a single molecule and is used in the present invention. Average molecular weight between these two groups capable of the curing reaction is greater than or equal to 10,000 and less than or equal to 150,000 for the reactive organopolysiloxane (L), which is a reactive organopolysiloxane having at least two curing reaction-capable groups within a single molecule and is used in the present invention. These reactive organopolysiloxanes are contained in the molecule as a short chain non-reactive polymer part and a long chain non-reactive polymer part, respectively. Here, the molecular weight between these two groups capable of the crosslinking reaction, in the case of a chain type organopolysiloxane that has reactive functional groups only at both terminals of the molecular chain, is defined as the molecular weight of the non-reactive polysiloxane part (not including the siloxy units at both terminals). In the case of molecular weight between multiple crosslinking reaction-capable groups, this is the molecular weight of the longest part.

When the component (S) and component (L) are used together in a range of 1:99 to 40:60 as reactive organopolysiloxane raw materials, it is possible to introduce parts of different chain lengths in the silicone chain part constituting the silicone elastomer obtained by the curing reaction. By this means, it is possible to reduce permanent strain of the obtained silicone polymer, and it is possible to decrease the mechanical energy conversion loss. In particular, when the silicone elastomer of the present invention is used in the dielectric layer of a transducer, this combined use of the component (S) and component (L) has the practical advantage of increasing the energy conversion efficiency.

As mentioned previously, it is possible to use a group capable of condensation reaction, addition reaction, peroxide reaction, or photoreaction as the curing reaction-capable groups of these components. However, this is preferably an addition reaction capable group. Among addition reaction capable groups, the group is preferably a group active in a hydrosilylation reaction, i.e. a silicon atom-bonded hydrogen atom or an aliphatic unsaturated bond-containing group (such as an alkenyl group of 2 to 20 carbon atoms, or the like). Specific examples of the reactive organopolysiloxanes (S) and (L) are the examples cited as the aforementioned reactive organopolysiloxanes represented by $M_a M^R_b D_c D^R_d T_e T^R_f Q_g$ and the examples cited as the aforementioned reactive organopolysiloxanes having curing reaction-capable groups only at both molecular chain terminals. For the same reasons as described above, part of the methyl groups may be replaced by an ethyl group, propyl group, butyl group, hexyl group, or phenyl group.

A value of the blend ratio (weight content ratio) S:L of the component (S) to the below described component (L) that departs from the range of 1:99 to 40:60 is inappropriate due to non-ability to satisfy at least one type of characteristic of the obtained cured article, these characteristics including high break elongation, high mechanical strength, high dielectric breakdown strength, and low elastic modulus.

The blend ratio (molar ratio) of the silicon atom-bonded hydrogen atoms to silicon atom-bonded unsaturated hydrocarbon groups (Vi) in the polysiloxane is preferably in the range of 0.5 to 3.0. When this blend ratio deviates from the aforementioned range, the residual functional groups remaining after curing due to the hydrosilylation reaction may adversely affect material physical properties of the cured article.

[Characteristic 4] Number of Crosslink Points Per Unit Weight after the Curing Reaction Furthermore, the curable organopolysiloxane composition for transducers of the present invention comprises the below described (A) and (B). The number of crosslink points per unit weight after the curing reaction of the reactive polysiloxane is defined by the below listed calculation formulae based on the number average molecular weights of each component of the (A) component and (B) component, the values in the below described general formulae of $a_i$ to $g_i$ and $a_j$ to $g_j$, and the contents of each of the components in the composition. This number of crosslink points per unit weight after the curing reaction of the reactive polysiloxane is preferably in the range of 0.5 to 20 μmol/g, and further preferably is in the range of 0.5 to 10 μmol/g.

(A) An organohydrogenpolysiloxane comprising one or multiple components, represented by general formula $M_{ai} M^H_{bi} D_{ci} D^H_{di} T_{ei} T^H_{fi} Q_{gi}$, having a number average molecular weight (Mw) in the range of 300 to 15,000, and having at least 2 silicon-bonded hydrogen atoms on average in a single molecule (B) An organopolysiloxane comprising one or multiple components, represented by general formula $M_{aj} M^{Vi}_{bj} D_{cj} D^{Vi}_{dj} T_{ej} T^{Vi}_{fj} Q_{gj}$, having a number average molecular weight (Mw) in the range of 300 to 100,000, and having at least 2 alkenyl groups on average in a single molecule Within the aforementioned general formulae, M represents $R_3SiO_{1/2}$; D represents $R_2SiO_{2/2}$; T represents $RSiO_{3/2}$; and Q is the siloxane unit represented by $SiO_{4/2}$; R is a monovalent organic group not having an aliphatic carbon-carbon double bond; $M^H$, $D^H$, and $T^H$ are siloxane units in which one of the R groups of the siloxane units represented by M, D, and T, respectively, is replaced by a silicon atom-bonded hydrogen atom; $M^{Vi}$, $D^{Vi}$, and $T^{Vi}$ are siloxane units in which one of the R groups of the siloxane units represented by M, D, and T, respectively, is replaced by an alkenyl group of 2 to 20 carbon atoms; a is an average number per single molecule; b is an average number per single molecule; c is an average number per single molecule; d is an average number per single molecule; e is an average number per single molecule;

f is an average number per single molecule; and g is an average number per single molecule; i represents the i-th component in the component (A); and j represents the j-th component in the component (B).

The aforementioned number of crosslink points per unit weight is calculated using the below listed values of the indices defined by each of the formulae for (i) the index of probability of inter terminal group reaction, (ii) the index of number of crosslink points of the reaction composition, (iii) the index of raw material mole count in the reaction composition, and (iv) the index of molecular weight of the reaction composition:

(Number of cross link points per unit weight) =

$$\frac{\left(\begin{array}{c}\text{The index of number of cross link}\\ \text{points of the reaction composition}\end{array}\right)}{\left(\begin{array}{c}\text{The index of raw material mole}\\ \text{count in the reaction composition}\end{array}\right) \times \left(\begin{array}{c}\text{The index of molecular weight}\\ \text{of the reaction composition}\end{array}\right)}$$

Here, the formulae defining each of the aforementioned indices are listed below:

(i) The index of probability of inter terminal group reaction is represented by the following formula.

(The index of probability of inter terminal group reaction) =

$$\left(\frac{\sum_{i=1}^{p}\frac{\alpha_i}{Mw_i}b_i}{\sum_{i=1}^{p}\frac{\alpha_i}{Mw_i}(b_i+d_i+f_i)}\right) \times \left(\frac{\sum_{j=1}^{r}\frac{\beta_j}{Mw_j}b_j}{\sum_{j=1}^{r}\frac{\beta_j}{Mw_j}(b_j+d_j+f_j)}\right)$$

(ii) The index of number of crosslink points of the reaction composition is represented by the below formula based on the aforementioned index of probability of inter terminal group reaction).

(The index of number of cross link points of the reaction composition) =

$$\frac{1}{2} \times \left(\sum_{i=1}^{p}\frac{\alpha_i}{Mw_i}(b_i+d_i) + \sum_{j=1}^{r}\frac{\beta_j}{Mw_j}(b_j+d_j)\right) +$$

$$\sum_{i=1}^{p}\frac{\alpha_i}{Mw_i}(e_i+f_i+g_i) + \sum_{j=1}^{r}\frac{\beta_j}{Mw_j}(e_j+f_j+g_j) -$$

$$\frac{1}{2} \times (\text{The index of probability of inter terminal group reaction}) \times$$

$$\left(\sum_{i=1}^{p}\frac{\alpha_i}{Mw_i}(b_i+d_i+f_i) + \sum_{j=1}^{r}\frac{\beta_j}{Mw_j}(b_j+d_j+f_j)\right)$$

However, in the calculation of the index of the number of crosslink points of the reaction composition, a component in which the value of $(a+c)/(b+d+e+f+g)$ representing the average number of organosiloxane units between reactive groups in the molecular chain is less than 3 is treated as acting as a single crosslink point, and for such a component, the calculation is performed by $(b+d)=0$, and $(e+f+g)=1$.

(iii) The index of raw material mole count in the reaction composition is represented by the following formula.

(The index of raw material mole count in the reaction composition) =

$$\sum_{i=1}^{p}\frac{\alpha_i}{Mw_i} + \sum_{j=1}^{r}\frac{\beta_j}{Mw_j}$$

(iv) The index of molecular weight of the reaction composition is represented by the following formula.

(The index of molecular weight in the reaction composition) =

$$\left(\frac{\sum_{i=1}^{p}\alpha_i Mw_i}{\sum_{i=1}^{p}\alpha_i}\right) + \left(\frac{\sum_{j=1}^{r}\beta_j Mw_j}{\sum_{j=1}^{r}\beta_j}\right)$$

Here, $\alpha_i$ is the value of the blending amount $\alpha^w_i$ (an amount by weight) of the i-th component of the component (A) divided by the ratio ($\gamma$=H(moles)/V(moles)) of the number H (moles) of silicon-bonded hydrogen atoms contained in the component (A) and the number V (moles) of alkenyl groups contained in the component (B), i.e. $\alpha_i = \alpha^w_i / \gamma$; $\beta_j$ represents the blending amount (an amount by weight) of the j-th component of the component (B); $M_{wi}$ represents number average molecular weight of the i-th component of the component (A); and $M_{wj}$ represents number average molecular weight of the j-th component of the component (B).

[Characteristic 5] Molecular Weight Between Crosslink Points after the Curing Reaction Furthermore, the molecular weight between crosslink points of the reactive polysiloxane after the curing reaction is defined by the below formulae based on the number average molecular weight of each of the components of the (A) component and (B) component, the values of $a_i$ to $g_i$ and $a_j$ to $g_j$ of the below general formulae, and the amounts of each component in the composition, where this molecular weight between crosslink points of the reactive polysiloxane after the curing reaction is preferably in the range of 100,000 to 2,000,000, and further preferably is in the range of 200,000 to 2,000,000:

(A) is an organohydrogenpolysiloxane comprising one or multiple components, represented by general formula $M_{ai}M^H_{bi}D_{ci}D^H_{di}T_{ei}T^H_{fi}Q_{gi}$, having a number average molecular weight (Mw) in the range of 300 to 15,000, and having at least 2 silicon-bonded hydrogen atoms on average in a single molecule.

(B) is an organopolysiloxane comprising one or multiple components, represented by general formula $M_{aj}M^{Vi}_{bj}D_{cj}D^{Vi}_{dj}T_{ej}T^{Vi}_{fj}Q_{gj}$, having a number average molecular weight (Mw) in the range of 300 to 100,000, and having at least 2 alkenyl groups on average in a single molecule.

(C) is a catalyst for addition reaction between the aforementioned component (A) and component (B).

Within the aforementioned general formulae, M represents $R_3SiO_{1/2}$; D represents $R_2SiO_{2/2}$; T represents $RSiO_{3/2}$; and Q is the siloxane unit represented by $SiO_{4/2}$; R is a monovalent organic group not having an aliphatic carbon-carbon double bond; $M^H$, $D^H$, and $T^H$ are siloxane units in which one of the R groups of the siloxane units represented by M, D, and T, respectively, is replaced by a silicon atom-bonded hydrogen atom; $M^{Vi}$, $D^{Vi}$, and $T^{Vi}$ are siloxane units in which one of the R groups of the siloxane units represented by M, D, and T, respectively, is replaced by an alkenyl group of 2 to 20 carbon atoms; a is an average number per single molecule; b is an average number per single molecule; c is an average number per single molecule; d is an average number per single molecule; e is an average number per single molecule; f is an average number per single molecule; and g is an average number per single molecule; i represents the i-th component in the component (A); and j represents the j-th component in the component (B).

The aforementioned molecular weight between crosslink points is based on the index values calculated based on the below represented calculation formulae for (i) the index of probability of inter terminal group reaction, (ii') the index of organosiloxane chain count of the reaction composition, (iii) the index of raw material mole count in the reaction composition, and (iv) the index of molecular weight of the reaction composition:

$$\text{(Molecular weight between cross link points)} = \frac{\text{(The index of molecular weight of the reaction composition)} \times \text{(The index of raw material mole count in the reaction composition)}}{\text{(The index of organosiloxane chain count of the reaction composition)}}$$

Here, the formulae defining each of the aforementioned indices are listed below:

(i) The index of probability of inter terminal group reaction is represented by the following formula.

$$\text{(The index of probability of inter terminal group reaction)} = \left(\frac{\sum_{i=1}^{p} \frac{\alpha_i}{Mw_i} b_i}{\sum_{i=1}^{p} \frac{\alpha_i}{Mw_i}(b_i + d_i + f_i)}\right) \times \left(\frac{\sum_{j=1}^{r} \frac{\beta_j}{Mw_j} b_j}{\sum_{j=1}^{r} \frac{\beta_j}{Mw_j}(b_j + d_j + f_j)}\right)$$

(ii') The index of organosiloxane chain count of the reaction composition is represented by the following formula.

$$\text{(The index of organosiloxane chain count of the reaction composition)} = \sum_{i=1}^{p} \left(\frac{\alpha_i}{Mw_i}(d_i + 2e_i + 2f_i + 3g_i + 1)\right) + \sum_{j=1}^{r} \frac{\beta_j}{Mw_j}(d_j + 2e_j + 2f_j + 3g_j + 1) - \frac{1}{2} \times \text{(The index of probability of inter terminal group reaction)} \times \left(\sum_{i=1}^{p} \frac{\alpha_i}{Mw_i}(b_i + d_i + f_i) + \sum_{j=1}^{r} \frac{\beta_j}{Mw_j}(b_j + d_j + f_j)\right)$$

However, in the calculation of the index of number of crosslink points of the reaction composition, a component for which the value of (a+c)/(b+d+e+f+g) representing average number of organosiloxane units between reactive groups in the molecular chain is less than 3 is taken to act as a single crosslink point, and calculation for such a component assumes (d+2e+2f+3g+1)=0.

(iii) The index of raw material mole count in the reaction composition is represented by the following formula.

$$\text{(The index of raw material mole count in the reaction composition)} = \sum_{i=1}^{p} \frac{\alpha_i}{Mw_i} + \sum_{j=1}^{r} \frac{\beta_j}{Mw_j}$$

(iv) The index of molecular weight of the reaction composition is represented by the following formula.

$$\text{(The index of molecular weight in the reaction composition)} = \left(\frac{\sum_{i=1}^{p} \alpha_i Mw_i}{\sum_{i=1}^{p} \alpha_i}\right) + \left(\frac{\sum_{j=1}^{r} \beta_j Mw_j}{\sum_{j=1}^{r} \beta_j}\right)$$

In the aforementioned formulae, $\alpha_i$ is the value of the blending amount $\alpha^w_i$ (an amount by weight) of the i-th component of the component (A) divided by the ratio ($\gamma$=H(moles)/V(moles)) of the number H (moles) of silicon-bonded hydrogen atoms contained in the component (A) and the number V (moles) of alkenyl groups contained in the component (B), i.e. $\alpha_i = \alpha^w_i/\gamma$; $\beta_j$ represents the blending amount (an amount by weight) of the j-th component of the component (B); $M_{wi}$ represents number average molecular weight of the i-th component of the component (A); and $M_{wj}$ represents number average molecular weight of the j-th component of the component (B). The aforementioned number average molecular weight (Mw) is a value determined by measurement by nuclear magnetic resonance (NMR).

By molecular design, so as to adjust the number of crosslink points per unit weight and the molecular weight between crosslink points after curing of the organopolysiloxane to within certain ranges based on the formulae described in this patent specification, it is possible to perform adjustment such that the obtained silicone elastomer cured article has electrical characteristics and mechanical properties suitable for a member of a transducer. By such molecular design, it is possible to obtain an addition-curable organopolysiloxane composition for the production of a silicone elastomer cured article and silicone elastomer suitable as materials for use as a dielectric material having excellent characteristics, a dielectric material for a transducer member, particularly a dielectric elastomer, and further particularly a member for a transducer.

[Curing Agent (C)]

The curable organopolysiloxane composition for transducers of the present invention comprises a curing agent (C) as a necessary ingredient.

The component (C) is preferably a generally known hydrosilylation reaction catalyst. No particular limitation is placed on the component (C) used in the present invention, as long as the component (C) is a substance capable of promoting the hydrosilylation reaction. This component (C) is exemplified by platinum based catalysts, rhodium based catalysts, and palladium based catalysts. Due to high catalyst activity, particularly platinum family element catalysts and platinum family element compound catalysts are cited as the component (C). Without particular limitation, platinum based catalysts are exemplified by platinum fine powder, platinum black, chloroplatinic acid, alcohol-modified chloroplatinic acid; olefin-platinum complexes, platinum-carbonyl complexes such as platinum bis-acetoacetate), platinum bis(acetylacetate), or the like; chloroplatinic acid-alkenyl siloxane complexes such as chloroplatinic acid-divinyltetramethyldisiloxane complex, chloroplatinic acid-vinyltetramethylcyclotetrasiloxane complex, or the like; platinum-alkenylsilsoxane complexes such as platinum-divinyltetramethyldisiloxane complex, platinum-tetravinyltetramethylcyclotetrasiloxane complex, or the like; and complexes between chloroplatinic acid and acetylene alcohols. Due to high catalyst activity with respect to hydrosilylation reactions, recommended examples of the component (C) are platinum-alkenylsiloxane complexes, and particularly platinum 1,3-divinyl-1,1,3,3-tetramethyldisiloxane complexes.

Moreover, for further improvement of stability of the platinum-alkenylsiloxane complex, these platinum-alkenylsiloxane complexes may be dissolved in an organosiloxane oligomer such as alkenylsiloxane oligomers of 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinylcyclotetrasiloxane, or the like; or dimethylsiloxane oligomers; or the like. In particular the use of a platinum-alkenylsiloxane complex dissolved in an alkenylsiloxane oligomer is preferred.

The utilized amount of the component (C) may be any amount capable of promoting the addition reaction of the polysiloxane component of the present composition, without particular limitation. Relative to the entire weight of the polysiloxane component, the concentration of a platinum family metal element contained in the component (C) (e.g. platinum) is normally in the range of 0.01 to 500 ppm, preferably is in the range of 0.1 to 100 ppm, and further preferably is in the range of 0.1 to 50 ppm.

[Dielectric Inorganic Fine Particles (D)]

The curable organopolysiloxane composition for transducers of the present invention is characterized as containing, as necessary ingredients, the curable organopolysiloxane composition having the aforementioned characteristics, a curing agent, and (D) dielectric particles having a specific dielectric constant at 1 kHz of greater than or equal to 10 at room temperature. By supporting the dielectric inorganic fine particles in the cured article comprising the aforementioned curable organopolysiloxane, the physical characteristics and electrical characteristics needed for a transducer are both satisfied.

The dielectric inorganic fine particles, for example, may be selected from among metal oxides (D1) represented by the below listed Formula (D1) (sometimes abbreviated hereinafter as the "metal oxide (D1)"):

(in the formula,
$M^a$ is a family 2 metal of the periodic table;
$M^b$ is a family 4 metal of the periodic table;
na is a number ranging from 0.9 to 1.1;
nb is a number ranging from 0.9 to 1.1; and
nc is a number ranging from 2.8 to 3.2).

Preferred examples of the family 2 periodic table metal $M^a$ in the metal oxide (D1) include beryllium (Be), magnesium (Mg), calcium (Ca), strontium (Sr), and barium (Ba). Titanium (Ti) is cited as a preferred example of a family 4 periodic table metal $M^b$. In the particles of metal oxides represented by the Formula (X1), $M^a$ and $M^b$ may each be a single element, or may be 2 or more elements.

Specific examples of the metal oxide (D1) include barium titanate, calcium titanate, and strontium titanate.

Moreover, the dielectric inorganic fine particles, for example, may be selected from among metal oxides (hereinafter, can be referred to as "metal oxide (D2)") represented by:

(in the formula,
$M^a$ is a family 2 metal of the periodic table;
$M^{b'}$ is a family 5 metal of the periodic table;
na is a number ranging from 0.9 to 1.1;
nb' is a number ranging from 0.9 to 1.1; and
nc is a number ranging from 2.8 to 3.2).

Preferred examples of the family 2 periodic table metal $M^a$ in the metal oxide (D2) include beryllium (Be), magnesium (Mg), calcium (Ca), strontium (Sr), and barium (Ba). Preferred examples of the family 5 periodic table metal element $M^{b'}$ include tin (Sn), antimony (Sb), zirconium (Zr), and indium (In). In the particles of the metal oxide represented by the formula (X2), $M^a$ and $M^{b'}$ may each be a single type of element, or may be 2 or more elements.

Specific examples of the metal oxide (D2) include magnesium stannate, calcium stannate, strontium stannate, barium stannate, magnesium antimonate, calcium antimonate, strontium antimonate, barium antimonate, magnesium zirconate, calcium zirconate, strontium zirconate, barium zirconate, magnesium indate, calcium indate, strontium indate, barium indate, or the like.

Further, in combination with such metal oxide particles, it is permissible to use particles of other metal oxides such as lead titanate zirconate, zinc titanate, lead titanate, titanium oxide, or the like (particularly titanium oxide composite oxides other than those previously listed). Moreover, solid solutions comprising metal elements different from these examples may be used as the dielectric inorganic fine particles (D). In this case, the other metal elements are exemplified by La (lanthanum), Bi (bismuth), Nd (neodymium), Pr (praseodymium), or the like.

Among such inorganic fine particles, preferred examples of the dielectric inorganic fine particles (D) include one or more types of inorganic fine particles selected from the group consisting of titanium oxide, barium titanate, strontium titanate, lead titanate zirconate, and barium titanate, and composite metal oxides in which the barium and titanium positions of barium titanate are partially replaced by an alkaline earth metal, such as calcium or strontium; zirconium; or rare earth metal, such as yttrium, neodymium, samarium, or dysprosium. Titanium oxide, barium titanate, strontium titanate, and composite metal oxide in which the barium positions of barium titanate and barium zirconate are partially replaced by calcium are more preferred, and titanium oxide and barium titanate are most preferred.

No particular limitation is placed on the morphology of the dielectric inorganic fine particles (D), and any morphology may be used, such as spherical, tabular, needle-like, fibrous, or the like. No particular limitation is placed on particle diameter of the inorganic fine particles, and if the spherical fine particles are measured by the laser diffraction method, for example, the volume average particle diameter may be in the range of 0.01 to 1.0 μm, for example. From the standpoints of molding-processing ability and film forming ability, the average particle diameter is preferably in the range of 0.1 to 5 μm. If the inorganic fine particles are anisotropic fine particles in which the morphology is tabular, needle-like, fibrous, or the like, although no limitation is placed on the aspect ratio of such fine particles, the aspect ratio may normally be greater than or equal to 5.

No particular limitation is placed on the particle size distribution of the dielectric inorganic fine particles, and the dielectric inorganic fine particles may be monodispersed, or alternatively, it is possible to produce a distribution in the particle diameters so as to improve mechanical strength by filling at higher density by lowering the void fraction between fine particles. As a measure of the particle diameter distribution, the ratio ($D_{90}/D_{10}$) of the particle diameter at 90% cumulative area ($D_{90}$) over the particle diameter at 10% cumulative area ($D_{10}$) of the cumulative particle diameter distribution curve measured by the laser light diffraction method is preferably greater than or equal to 2. Moreover, no limitation is placed on the particle diameter distribution shape (relationship between particle diameter and particle concentration), It is possible to have a so-called plateau shaped distribution, or a particle diameter distribution that is multi-modal, i.e. bimodal (i.e. Having two hill-shaped distributions), tri-modal, or the like.

In order to make particle size distributions such as those described above for the dielectric inorganic fine particles used in the present invention, methods may be adopted, for example, such as combined use of two or more types of fine particles having different average diameters or particle size distributions, blending of particles of particle diameter fractions obtained by sieving or the like to produce a desired particle size distribution, or the like.

Furthermore, these dielectric inorganic fine particles may be treated using various types of the below described surface treatment agents.

In consideration of mechanical characteristics and dielectric characteristics of the obtained cured article, the blended amount (loading fraction) of the dielectric inorganic fine particles in the curable organopolysiloxane composition for transducers of the present invention, relative to the entire volume of the composition, may be greater than or equal to 10%, preferably is greater than or equal to 15%, and further preferably is greater than or equal to 20%. Moreover, this blended amount relative to the total volume of the composition is preferably less than or equal to 80%, and further preferably is less than or equal to 70%.

As a preferred embodiment of the curable organopolysiloxane composition for transducers of the present invention, a composition is cited that comprises as necessary ingredients: (A1) at least one type of organohydrogenpolysiloxane having silicon atom-bonded hydrogen atoms at both molecular terminals and having a hydrogen atom weight content of 0.01 to 1.0% by weight, (A2) at least one type of organohydrogenpolysiloxane having at least 3 silicon atom-bonded hydrogen atoms in a single molecule and having a hydrogen atom weight content of 0.03 to 2.0% by weight, (B) at least one type of organopolysiloxane having at least 2 alkenyl groups in a single molecule and having an alkenyl group weight content of 0.05 to 0.5% by weight, (C1) a hydrosilylation reaction catalyst, and (D) dielectric inorganic fine particles having a specific dielectric constant at 1 kHz of greater than or equal to 10 at room temperature.

Here, (A1) is preferably a dimethylhydrogensiloxy group-doubly molecular chain terminated polydimethylsiloxane. Preferred examples of (A2) include trimethylsiloxy group-doubly molecular chain terminated dimethylsiloxane-methylhydrogensiloxane copolymers and dimethylhydrogensiloxy group-doubly molecular chain terminated dimethylsiloxane-methylhydrogensiloxane copolymers. On the other hand, the (B) component is exemplified by dimethylvinylsiloxy group-doubly molecular chain terminated polydimethylsiloxanes. In order to further optimize transducer material characteristics such as mechanical characteristics, dielectric characteristics, heat resistance, or the like, part of the methyl groups of the polymers may be replaced by an ethyl group, propyl group, butyl group, hexyl group, or phenyl group.

No particular limitation is placed on molecular weights of (A1), (A2), and (B), as long as the weight content of the hydrogen atoms and the weight content of the alkenyl groups are in the aforementioned ranges. However, the number of siloxane units is preferably 5 to 1,500.

The curable organopolysiloxane composition of the present invention is a curable organopolysiloxane composition used for transducers, and the curable organopolysiloxane composition of the present invention may be further provided with the below described characteristics.

[Other Inorganic Particles (E)]

The curable organopolysiloxane composition of the present invention may further comprise one or more types of inorganic particles (E) selected from the group consisting of electrically conductive inorganic particles, insulating inorganic particles, and reinforcing inorganic particles.

No particular limitation is placed on the utilized electrically conductive inorganic particles as long as the electrically conductive inorganic particles impart electrical conductivity, and it is possible to use any morphology, such as particle-shaped, flake-shaped, and fibrous (including whiskers). Specific examples of electrically conductive inorganic particles include: electrically conductive carbon such as electrically conductive carbon black, graphite, monolayer carbon nanotubes, double layer carbon nanotubes, multi-layer carbon nanotubes, fullerenes, fullerene-encapsulated metals, carbon nanofibers, gas phase-grown mono-length carbon (VGCF), carbon micro-coils, or the like; and metal powders such as platinum, gold, silver, copper, nickel, tin, zinc, iron, aluminum, or the like powders; as well coated pigments such as antimony-doped tin oxide, phosphorous-doped tin oxide, needle-shaped titanium oxide surface treated using tin/antimony oxide, tin oxide, indium oxide, antimony oxide, zinc antimonate, carbon, and graphite or carbon whiskers surface treated by tin oxide or the like; pigments coated by at least one type of electrically conductive oxide such as tin-doped indium oxide (ITO), fluorine-doped tin oxide (FTO), phosphorous-doped tin oxide, and phosphorous-doped nickel oxide; pigments having electrical conductivity and containing tin oxide and phosphorous in the surface of titanium oxide particles; these electrically conductive inorganic particles being optionally surface treated using various types of the below described surface treatment agents. Such electrically conductive inorganic particles may be used as one type or as a combination of 2 or more types.

Furthermore, the electrically conductive inorganic fine particles may be fibers such as glass fibers, silica alumina fibers, alumina fibers, carbon fibers, or the like, or needle-like reinforcing materials such as aluminum borate whiskers, potassium titanate whiskers, or the like; or an inorganic filler material such as glass beads, talc, mica, graphite, wollastonite, dolomite, or the like, that have been surface coated by an electrically conductive substance such as a metal or the like.

By blending the electrically conductive inorganic particles into the composition, it is possible to increase the specific dielectric constant of the polysiloxane cured article. The blended amount of such electrically conductive inorganic particles relative to the curable organopolysiloxane composition is preferably in the range of 0.01 to 10% by weight, and further preferably is in the range of 0.05 to 5% by weight. When the blended amount departs from the aforementioned preferred range, the effect of blending is not obtained, or there may be a lowering of the dielectric breakdown strength of the cured article.

The insulating inorganic particles utilized in the present invention may be any generally known insulating inorganic material. That is to say, particles of any inorganic material having a volume resistance value of $10^{10}$ to $10^{19}$ Ohm·cm may be used without restriction, and any morphology may be used, such as particulate, flake-like, and fibrous (including whiskers). Preferred specific examples include spherical particle, tabular particles, and fibers of ceramics; particles of metal silicates such as alumina, mica and talc or the like; and quartz, glass, or the like. Moreover, such insulating inorganic particles may be surface treated using the various types of below described surface treatment agents. Such electrically conductive inorganic particles may be used as one type or as a combination of 2 or more types.

By blending the insulating inorganic particles into the composition, it becomes possible to increase the mechanical strength and dielectric breakdown strength of the polysiloxane cured article, and the specific dielectric constant may sometimes be observed to increase. The blended amount of these insulating inorganic particles, relative to the curable organopolysiloxane composition, is preferably in the range of 0.1 to 20% by weight, and further preferably is in the range of 0.1 to 5% by weight. When the blended amount of the insulating inorganic particles deviates from the aforementioned preferred range, the effect of blending is not obtained, or there may be a lowering of the mechanical strength of the cured article.

The reinforcing inorganic particles used in the present invention are exemplified by fumed silica, wet type silica, ground silica, calcium carbonate, diatomaceous earth, finely ground quartz, various types of non-alumina metal oxide powders, glass fibers, carbon fibers, or the like. Moreover, such reinforcing inorganic particle may be used after treatment using the below described various types of surface treatment agents. Here, although no limitation is placed on the particle diameter of the reinforcing inorganic particles, the specific surface area is preferably greater than or equal to 50 m$^2$/g and less than or equal to 300 m$^2$/g from the standpoint of improvement of mechanical strength, fumed silica is particularly preferred. Further, from the standpoint of improvement of dispersability, the fumed silica is preferably surface treated using the below described silica coupling agent. However, when the (A) curable organopolysiloxane composition is an addition-curable type organopolysiloxane composition, fumed silica surface treated using silazane is not used as the reinforcing inorganic particles. These reinforcing inorganic particles may be used as a single type, or may be used as a combination of 2 or more types.

By blending the reinforcing inorganic particles into the composition, it becomes possible to increase mechanical strength and dielectric breakdown strength of the polysiloxane cured article. The blended amount of these reinforcing inorganic particles relative to the curable organopolysiloxane composition is preferably in the range of 0.1 to 30% by weight, and further preferably in the range of 0.1 to 10% by weight. When the blended amount deviates from the aforementioned preferred range, the effect of blending and the inorganic particles is not obtained or molding processability of the curable organopolysiloxane composition may decrease.

The curable organopolysiloxane composition of the present invention may further comprise thermally conductive inorganic particles. The thermally conductive inorganic particles are exemplified by metal oxide particles such as magnesium oxide, zinc oxide, nickel oxide, vanadium oxide, copper oxide, iron oxide, silver oxide, or the like; and inorganic compound particles such as aluminum nitride, boron nitride, silicon carbide, silicon nitride, boron carbide, titanium carbide, diamond, diamond-like carbon, or the like. Zinc oxide, boron nitride, silicon carbide, and silicon nitride are preferred. By blending these thermally conductive inorganic particles into the composition, it becomes possible to increase the thermal conductivity of the polysiloxane cured article. Relative to the curable organopolysiloxane composition, the blended amount of these reinforcing inorganic particles is preferably in the range of 0.1 to 30% by weight.

[Surface Treatment of the Inorganic Particles or the Like]

However, part or the entire quantity of the aforementioned dielectric inorganic fine particles (D) and at least one type of the inorganic particles (E) used in the curable organopolysiloxane composition of the present invention may undergo surface treatment by use of at least one type of surface treatment agent. No particular limitation is placed on the type of surface treatment, and such surface treatment is exemplified by hydrophilization treatment and hydrophobizing treatment. Hydrophobization treatment is preferred. When inorganic particles are used that have undergone hydrophobizing treatment, it is possible to increase the degree of loading of the inorganic particles in the organopolysiloxane composition. Moreover, increase of viscosity of the composition is suppressed, and molding processability is improved.

The aforementioned surface treatment may be performed by treatment (or coating treatment) of the inorganic particles using a surface treatment agent. The surface treatment agent used for hydrophobizing is exemplified by at least one type of surface treatment agent selected from the group consisting of organic titanium compounds, organic silicon compounds, organic zirconium compounds, organic aluminum compounds, and organic phosphorous compounds. The surface treatment agent may be used as a single type or may be used as a combination of 2 or more types.

The organic titanium compound is exemplified by coupling agents such as alkoxy titanium, titanium chelates, titanium acrylates, or the like. Preferred coupling agents among such compounds are exemplified by alkoxy titanium compounds such as tetraisopropyl titanate or the like, and titanium chelates such as tetraisopropyl bis(dioctylphosphate) titanate or the like.

The organic silicon compound is exemplified by low molecular weight organic silicon compounds such as silanes, silazanes, siloxanes, or the like; and organic silicon polymers or oligomers such as polysiloxanes, polycarbosiloxanes, or the like. Preferred silanes are exemplified by so-called silane coupling agents. Representative examples of such silane coupling agents include alkyltrialkoxysilanes (such as methyltrimethoxysilane, vinyltrimethoxysilane, hexyltrimethoxysilane, octyltrimethoxysilane, or the like), organic functional group-containing trialkoxysilane (such as glycidoxypropyltrimethoxysilane, epoxycyclohexylethyltrimethoxysilane, methacryloxypropyltrimethoxysilane, aminopropyltrimethoxysilane, or the like). Preferred siloxanes and polysiloxanes include hexamethyldisiloxane, 1,3-dihexyl-tetramethyldisiloxane, trialkoxysilyl single-terminated polydimethylsiloxane, trialkoxysilyl single-terminated dimethylvinyl single-terminated polydimethylsiloxane, trialkoxysilyl single terminated organic functional group single-terminated polydimethylsiloxane, trialkoxysilyl doubly terminated polydimethylsiloxane, organic functional group doubly-terminated polydimethylsiloxane, or the like. When a siloxane is used, the number n of siloxane bonds is preferably in the range of 2 to 150. Preferred silazanes are exemplified by hexamethyldisilazane, 1,3-dihexyl-tetramethyldisilazane, or the like. Preferred polycarbosiloxanes are exemplified by polymers that have Si—C—C—Si bonds in the polymer main chain.

The organic zirconium compound is exemplified by alkoxy zirconium compounds such as tetraisopropoxy zirconium or the like and zirconium chelates.

The organic aluminum compound is exemplified by alkoxy aluminum and aluminum chelates.

The organic phosphorous compound is exemplified by phosphite esters, phosphate esters, and phosphorous acid chelates.

Among these surface treatment agents, organic silicon compounds are preferred. Among such organic silicon compounds, silanes, siloxanes, and polysiloxanes are preferred. As described previously, the use of alkyltrialkoxysilanes and trialkoxysilyl single-terminated polydimethylsiloxanes is most preferred.

The ratio of the surface treatment agent to the total amount of the aforementioned inorganic particles is preferably in the range of greater than or equal to 0.1% by weight and less than or equal to 10% by weight, and this range is further preferably greater than or equal to 0.3% by weight and less than or equal to 5% by weight. Furthermore, the treatment concentration is the ratio (weight ratio) of the fed inorganic particles to the fed treatment agent, and the excess treatment agent is preferably removed after treatment.

[Additive (F)]

The curable organopolysiloxane composition of the present invention may further comprise an additive (F) for improvement of mold releasability or insulation breakdown characteristics. The electrically active silicone elastomer sheet obtained by curing this polysiloxane composition as a thin sheet may be used with advantage as an electrically active film (dielectric layer or electrode layer) constituting a transducer. However, when mold releasability of the silicone elastomer sheet is poor during molding of the thin film, and particularly when a dielectric film is produced at high speed, the dielectric film may be damaged due to demolding. However, the curable organopolysiloxane composition for transducers of the present invention has excellent demolding characteristics, and thus the curable organopolysiloxane composition is advantageous in that it is possible to improve speed of production of the film without damaging the film. This additive further improves these features of the curable organopolysiloxane composition of the present invention, and this additive may be used as a single type or as a combination of 2 or more types. On the other hand, an additive for improvement of insulation breakdown characteristics, as per the name of the additive, is used for improvement of dielectric breakdown strength of the silicone elastomer sheet.

Demolding improvement additives (i.e. mold release agents) capable of use are exemplified by carboxylic acid type demolding agents, ester type demolding agents, ether type demolding agents, ketone type demolding agents, alcohol type demolding agents, or the like. Such demolding agents may be used alone as a single type or may be used as a combination of 2 or more types. Moreover, although the aforementioned demolding agents do not contain silicon atoms, it is also possible to use a demolding agent that contains silicon atoms, or it is possible to use a mixture of such demolding agents.

The demolding agent that does not contain silicon atoms may be selected, for example, from the group consisting of saturated or unsaturated fatty carboxylic acids such as palmitic acid, stearic acid, or the like; alkali metal salts of such fatty carboxylic acids (such as sodium stearate, magnesium stearate, calcium stearate, or the like); esters of fatty carboxylic acids and alcohols (such as 2-ethylhexyl stearate, glycerin tristearate, pentaerythritol monostearate, or the like), aliphatic hydrocarbons (liquid paraffin, paraffin wax, or the like), ethers (distearyl ether or the like), ketones (distearyl ketone or the like), higher alcohols (2-hexadecyloctadecanol or the like), and mixtures of such compounds.

The silicon atom-containing demolding agent is preferably a non-curable silicone type demolding agent. Specific examples of such silicone type demolding agents include non-organic modified silicone oils such as polydimethylsiloxane, polymethylphenylsiloxane, poly(dimethylsiloxane-methylphenylsiloxane) copolymers, poly(dimethylsiloxane-methyl(3,3,3-trifluoropropyl)siloxane copolymers, or the like; and modified silicone oils such as amino-modified silicones, amino polyether-modified silicones, epoxy-modified silicones, carboxyl-modified silicones, polyoxyalkylene-modified silicones, or the like. Such silicon atom-containing demolding agents may have any structure, such as linear, partially-branched linear, or ring shaped. Moreover, no particular limitation is placed on the viscosity of such silicon oils at 25° C. This viscosity is preferably in the range of 10 to 100,000 mPa·s, and further preferably is in the range of 50 to 10,000 mPa·s.

Although no particular limitation is placed on the blended amount of the demolding improvement additive, relative to the total amount of the curable organopolysiloxane, this amount is preferably in the range of greater than or equal to 0.1% by weight and less than or equal to 30% by weight.

On the other hand, the insulation breakdown characteristic improvement agent is preferably an electrical insulation improvement agent. The insulation breakdown characteristic improvement agent is exemplified by aluminum or magnesium hydroxides or salts, clay minerals, and mixtures of such. Specifically, the insulation breakdown characteristic improvement agent may be selected from the group consisting of aluminum silicate, aluminum sulfate, aluminum hydroxide, magnesium hydroxide, calcined clays, montmorillonite, hydrotalcite, talc, and mixtures of such agents. Moreover, as may be required, this insulation improvement agent may be surface treated by the aforementioned surface treatment method.

No particular limitation is placed on the blended amount of this insulation improvement agent. Relative to the total amount of the curable organopolysiloxane, this blended amount is preferably in the range of greater than or equal to 0.1% by weight and less than or equal to 30% by weight.

The curable organopolysiloxane composition of the present invention may comprise another organopolysiloxanes that differs from the aforementioned reactive organopolysiloxane that that has dielectric functional groups.

[Curing Mechanism]

In the same manner, the curable organopolysiloxane composition of the present invention may further comprise a compound that has highly dielectric functional groups and at least one group in the molecule capable of reacting by condensation curing reaction, addition curing reaction, peroxide curing reaction, or photo-curing reaction. This highly dielectric functional group is introduced to the obtained cured article (i.e. electrically active silicone elastomer) by the aforementioned curing reaction.

[Introduction of the Highly Dielectric Functional Group]

The curable organopolysiloxane composition of the present invention is characterized by comprising a silicon compound (Z) having a highly dielectric functional group, an organic compound (Z1) having at least one curable functional group and a highly dielectric functional group, or an organic compound (Z2) which is miscible with the curable organopolysiloxane composition and having a highly dielectric functional group. Preferably, The curable organopolysiloxane composition provides a cured body having a structure that the highly dielectric functional group is bonded to silicon atom via a covalent bond. Furthermore, part or the entire aforementioned reactive organopolysiloxane may be a reactive organopolysiloxane further having a highly dielectric functional group.

If an electrically active silicone elastomer obtained by curing the curable organopolysiloxane composition for transducers of the present invention is used for a dielectric layer, specific dielectric constant of the dielectric layer is preferably high, and highly dielectric functional groups may be introduced in order to improve the specific dielectric constant of the elastomer. Although no particular limitation is placed on the content of highly dielectric functional groups, the content is in a range of 1 to 80 mass %, preferably of 10 to 50 mass % to the entire siloxane component of the curable organopolysiloxane composition.

Specifically, dielectric properties may be increased for the curable organopolysiloxane composition and cured electrically active silicone elastomer obtained by curing the curable organopolysiloxane composition, by a method such as adding to the curable organopolysiloxane composition a component for imparting high dielectric properties, a method of introducing a highly dielectric group to the organopolysiloxane component constituting the curable organopolysiloxane composition, or a combination of such methods. Such specific embodiments and highly dielectric functional groups capable of introduction will be explained below.

In a first embodiment, the curable organopolysiloxane composition for transducers is formed from a curable organopolysiloxane composition that comprises an organic silicon compound that has a highly dielectric group. In this curable composition, part or the entire reactive organopolysiloxane contained in the curable composition is a reactive organopolysiloxane further having a highly dielectric functional group, and the specific dielectric constant of the electrically active silicone elastomer obtained by curing is increased.

In a second embodiment, an organic silicon compound having highly dielectric groups is added to the curable organopolysiloxane composition, and the mixture is cured to obtain an electrically active silicone elastomer that has an increased specific dielectric constant. An organic silicon compound having highly dielectric groups may be added separately from the component used for curing in this curable composition.

In a third embodiment, an organic compound having highly dielectric groups and functional groups reactive with the reactive organopolysiloxane contained in the curable composition is added to the curable organopolysiloxane composition, thereby increasing specific dielectric constant of the electrically active silicone elastomer obtained by curing. As a result of formation of bonds between the organic compound and the organopolysiloxane due to the functional groups of the organic compound that are reactive with the reactive organopolysiloxane in this curable composition, highly dielectric groups are introduced into the electrically active silicone elastomer obtained by curing.

In a fourth embodiment of the present invention, an organic compound miscible with the curable organopolysiloxane composition and having highly dielectric groups is added to the curable organopolysiloxane composition, and thus the specific dielectric constant of the electrically active silicone elastomer obtained by curing is increased. Due to miscibility between the organic compound and the organopolysiloxane in this curable composition, an organic compound having these highly dielectric groups is incorporated in the matrix of the electrically active silicone elastomer obtained by curing.

No particular limitation is placed on the highly dielectric group in the present invention, and the highly dielectric group may be any group capable of increasing dielectric properties of the obtained cured article obtained by curing the curable organopolysiloxane composition of the present invention in comparison to the dielectric properties when the group is not contained. Without limitation, examples of the highly dielectric group used in the present invention are listed below.

a) Halogen Atoms and Halogen Atom-Containing Groups

No particular limitation is placed on the halogen atom, and the halogen atom is exemplified by the fluorine atom and chlorine atom. The halogen atom-containing group may be selected as an organic group having one or more atoms of one or more types selected from fluorine atom and chlorine atom, as exemplified by halogenated alkyl groups, halogenated aryl groups, and halogenated aryl alkyl groups. Specific examples of halogen-containing organic groups include the chloromethyl group, 3-chloropropyl group, 3,3,3-trifluoropropyl group, and perfluoroalkyl group, without limitation. By introduction of such groups, it is possible to anticipate also an improvement of demolding ability of the cured article of the present invention and the cured article obtained from the composition.

b) Nitrogen Atom-Containing Groups

Nitrogen atom-containing groups are exemplified by the nitro group, cyano groups (e.g. cyanopropyl group and cyanoethyl group), amido groups, imido groups, ureido group, thioureido group, and isocyanate group.

c) Oxygen Atom-Containing Groups

The oxygen atom-containing group is exemplified by ether groups, carbonyl groups, and ester groups.

d) Heterocyclic Groups

The heterocyclic group is exemplified by an imidazole group, pyridine group, furan group, pyran group, thiophene group, phthalocyanine group, and complexes of such.

e) Boron-Containing Groups

The boron-containing group is exemplified by borate ester groups and boric acid salt groups.

f) Phosphorous-Containing Groups

The phosphorous-containing group is exemplified by the phosphine group, phosphine oxide group, phosphonate ester group, phosphite ester group, and phosphate ester group.

g) Sulfur-Containing Groups

The sulfur-containing group is exemplified by the thiol group, thioether group, sulfoxide group, sulfone group, thioketone group, sulfonate ester group, and sulfonamide group.

[Other Optional Ingredients: Curing Retardants or the Like]

The curable organopolysiloxane composition for transducers of the present invention may comprise additives normally blended in organopolysiloxane compositions. As long as the object of the curable organopolysiloxane composition for transducers of the present invention is not impaired, it is possible to blend any additives, such as a curing retardant (curing suppression agent), flame retardant, heat resistance improvement agent, colorant, solvent, or the like. If the curable organopolysiloxane composition is an addition reaction curable type organopolysiloxane composition, the curing retardant (curing suppression agent) is exemplified by alkyne alcohols such as 2-methyl-3-butyn-2-ol, 3,5-dimethyl-1-hexyn-3-ol, 2-phenyl-3-butyn-2-ol, or the like; enyne compounds such as 3-methyl-3-penten-1-yne, 3,5-dimethyl-3-hexen-1-yne, or the like; and benzotriazole; without limitation. The utilized amount of the curing retardant (curing suppression agent), relative to the total composition (weight basis), is preferably in the range of 1 to 50,000 ppm.

[Hybrid Type]

As long as the object of the present invention is not impaired, hybridization is possible by combining the curable organopolysiloxane composition for transducers of the present invention with a polymer other than the organopolysiloxane. By hybridization with a polymer having a higher dielectric constant than that of the organopolysiloxane with the organopolysiloxane, it may be possible to increase the dielectric constant of the composition of the present invention and the cured article obtained from the composition. Hybridization embraces the so-called polymer blending of the organopolysiloxane with a non-organopolysiloxane polymer, and forming a fused polymer by bonding together (i.e. so-called co-polymerization) the organopolysiloxane and the other polymer.

The curable organopolysiloxane composition of the present invention may be condensation curable, addition curable, peroxide curable, or photo-curable, although an addition curable organopolysiloxane composition is preferred. To this curable system may be further included the introduction of an organopolysiloxane molecule chain by the method of adding the aforementioned dielectric functional group to an acrylic group, methacrylic group, epoxy group, or thiol group. By use of this photo-curable part or electron beam-curable part, in addition to the addition curing reaction, it is possible to also use a photo-curing reaction or electron beam curing reaction. If such combined reactions are used, a compound known as a monomer and/or oligomer capable of curing by light or electron beam (such as (meth)acrylate esters and multifunctional (meth)acrylate compounds) may be further added to the aforementioned curable composition. Moreover, a so-called photosensitizer may be added.

[Mechanical Properties]

When the dielectric silicone elastomer that is this member for transducers obtained by curing of the curable organopolysiloxane composition of the present invention is thermally molded to a sheet of 2.0 mm thickness, it is then possible to have the below listed mechanical properties as measured based on JIS K 6249. However, according to the application of this dielectric silicone elastomer and other required electrical characteristics, it is possible to use a dielectric silicone elastomer having mechanical properties outside these mechanical property ranges.

(1) Young's modulus (MPa) at room temperature may be set in the range of 0.1 to 10 MPa, and the particularly preferred range is 0.1 to 2.5 MPa.

(2) Tear strength (N/mm) at room temperature may be set greater than or equal to 1 N/mm, and particularly is in the range greater than or equal to 2 N/mm.

(3) Tear strength (MPa) at room temperature may be set greater than or equal to 1 MPa, and particularly preferably is in the range greater than or equal to 2 MPa.

(4) Elongation at break (%) may be set greater than or equal to 100%, and from the standpoint of displacement amount of the transducer, is particularly preferably in the range of 200 to 1,000%.

[Dielectric Characteristics]

The dielectric silicone elastomer that is this member for transducers obtained by curing of the curable organopolysiloxane composition of the present invention has the below listed dielectric characteristics. In particular, one important characteristic of the present invention is that, in addition to attainment of mechanical characteristics, such as those described above, by the composition of the present invention, the composition displays an excellent specific dielectric constant in the low frequency region.

(1) When the curable organopolysiloxane composition is thermally molded into a sheet of 0.07 mm thickness, the dielectric breakdown strength (V/μm) may be set greater than or equal to 20 V/μm. Although the preferred dielectric breakdown strength will vary according to the application of the transducer, the dielectric breakdown strength is particularly preferably in the range greater than or equal to 30 V/μm.

(2) When the curable organopolysiloxane composition is thermally molded to a sheet of 1 mm thickness, the specific dielectric constant measured at 1 MHz measurement frequency and 23° C. measurement temperature may be set greater than or equal to 3.0. Although the preferred specific dielectric constant will change according to the required form of the dielectric layer and the type of the transducer, a particularly preferred range of specific dielectric constant under the aforementioned measurement conditions is greater than or equal to 5.0.

[Production Method]

The curable organopolysiloxane composition of the present invention may be produced by adding the curable organopolysiloxane component, a curing catalyst, dielectric inorganic fine particles having a specific dielectric constant at 1 kHz of greater than or equal to 10 at room temperature, and optionally at least one type of inorganic particle and other additive, to an extruder or kneader (e.g. at least one type of mechanical means selected from the group consisting of twin screw extruders, twin screw kneaders, and single blade type extruders), and then kneading the mixture. In particular, by using a twin screw extruder having a free volume of at least 5,000 (L/h) to knead the reactive organopolysiloxane component, dielectric inorganic fine particles, and a surface treatment agent, the present invention may form a silicon rubber composite (master batch) comprising a high concentration (e.g. at least 80% by weight) of filler. Then the other reactive organopolysiloxane components, curing catalyst, and other components are preferably added and kneaded to produce the curable organopolysiloxane composition.

Dielectric inorganic fine particle are dispersed well and at high density in the curable organopolysiloxane composition of the curable organopolysiloxane composition for transducers obtained by the aforementioned production method, and it is thus possible to produce a member for transducers that has good electrical characteristics and mechanical characteristics. Moreover, it is possible to obtain a uniform film-like cured article during production of the member for transducers, the electrical characteristics and mechanical characteristics of the obtained film-like cured article are excellent, and handling ability is excellent for lamination or the like.

In the aforementioned kneading process, no particular limitation is placed on the temperature during formation of a silicone rubber compound (master batch) that does not contain a vulcanization agent (curing catalyst). However, this temperature is set in the range of 40° C. to 200° C., and may be set in the range of 100° C. to 180° C. In a continuous process using a twin screw extruder or the like, the residence time during treatment may be set to about 30 seconds to 5 minutes.

[Use of Curable Organopolysiloxane Composition for Transducers of the Present Invention]

Due to the dielectric characteristics and mechanical characteristics of the electrically active silicone elastomer obtained by curing or semi-curing of the curable organopolysiloxane composition of the present invention, use is possible with particular advantage as a member for transducers selected from the group consisting of artificial muscles, actuators, sensors, and electricity generating elements. Specifically, after molding the curable organopolysiloxane composition into a sheet-like or film-like shape, the member may generally be cured by heating, irradiation by a high energy beam, or the like. Although no particular limitation is placed on the method for molding the curable organopolysiloxane composition into a film-like shape, the method is exemplified by a method of forming a coating film by coating of the curable organopolysiloxane composition on a substrate using previously widely known coating methods, a method of molding by passing the curable organopolysiloxane composition through an extruder equipped with a slot of the desired shape, or the like.

[Elastomer Film and Lamination]

Thickness of this type of film-like curable organopolysiloxane composition may be set in the range of 0.1 µm to 5,000 µm, for example. Depending on the aforementioned coating method and the absence or presence of a volatile solvent, thickness of the obtained cured article may be made thinner than thickness at the time of application of the composition.

After production of the film-like curable organopolysiloxane composition by the aforementioned method, thermal curing, room temperature curing or curing by high energy beam irradiation may be performed, while optionally applying an electrical field or magnetic field in a target orientation direction for the dielectric inorganic fine particles, or after orienting of the filler by application of a magnetic field or electrical field for a fixed time period. Although no particular limitation is placed on each curing operation or the conditions during each curing operation, if the curable organopolysiloxane composition is an addition type curable organopolysiloxane composition, curing is preferably performed in the temperature range of 90° C. to 180° C. by retention in this temperature range for 30 seconds to 30 minutes.

No particular limitation is placed on the silicone elastomer for transducers, and this thickness may be 1 to 2,000 µm, for example. The silicone elastomer for transducers of the present invention may be stacked as one layer or 2 or more layers. Furthermore, an electrode layer may be provided at both tips of the dielectric elastomer layer, and a configuration may be used in which the transducer itself is composed of multiple stacked electrode layers and the dielectric elastomer layers. Thickness of the silicone elastomer for transducers per single layer for such a configuration may be 0.1 µm to 1,000 µm. If such layers are stacked as at least 2 layers, the thickness per single layer may be 0.2 µm to 2,000 µm.

Although no particular limitation is placed on the molding method of the two or more silicon elastomer cured layers stacked in the aforementioned manner, a method may be used such as: (1) coating the curable organopolysiloxane composition on the substrate, during the coating, obtaining a cured silicone elastomer layer, and then further applying the curable organopolysiloxane composition on the same cured layer to repeatedly coat and cure to stack layers; (2) coating the curable organopolysiloxane composition in a stacked manner on the substrate in an uncured or semi-cured state, and curing the entire curable organopolysiloxane compositions that have been coated in a stacked manner; or a method that combines the (1) and (2) methods.

For example, the curable organopolysiloxane composition may be applied on the substrate by die coating, may be cured, 2 or more such silicone elastomer cured layers may be formed by stacking, and the silicon elastomer cured layers may be attached to the electrode layer for manufacture in the present application invention. For this configuration, the 2 or more stacked silicon elastomer cured layers are preferably dielectric layers, and the electrode is preferably an electrically conductive layer.

High speed coating is possible by die coating, and this coating method is highly productive. The transducer having the multilayered configuration of the present invention, after coating of a single layer containing the organopolysiloxane composition, may be produced by coating a layer that comprises a different organopolysiloxane composition. Moreover, production is possible by simultaneously coating multiple layers containing each organopolysiloxane composition.

The thin film-like silicone elastomer that is the member for transducers may be obtained by coating the aforementioned curable organopolysiloxane composition on the substrate, and then curing the assembly at room temperature and by heating, or by curing using high energy beam irradiation such as ultraviolet radiation or the like. Moreover, when the thin film-like dielectric silicone elastomer is stacked, uncured curable organopolysiloxane composition may be applied on the cured layer and then cured sequentially, or the uncured curable organopolysiloxane composition may be stacked in layers, and then the layers may be cured simultaneously.

The aforementioned thin film-like silicone elastomer is particularly useful as a dielectric layer for a transducer. It is possible to form a transducer by arrangement of electrode layers at both ends of the thin film-like silicone elastomer. Furthermore, by blending electrically conductive inorganic particles into the curable organopolysiloxane composition of the present invention, it is possible to provide functionality as an electrode layer. Furthermore, the "electrode layer" in the patent specification of the present invention is sometimes simply referred to as the "electrode."

One embodiment of the aforementioned member for transducers is sheet-like or film-like. Film thickness is generally 1 µm to 2,000 µm, and the film may have a structure that is a single layer, two or more layers, or a further number of stacked layers. Moreover, as may be desired, the stacked electrically active silicone elastomer layers, when used as dielectric layers, may be used with a film thickness of 5 µm to 10,000 µm, or such layers may be stacked to obtain greater thickness.

The thin film-like silicone elastomer layer that is this member for transducers may be formed by stacking the same thin film-like silicone elastomer, or thin film-like silicone elastomers of 2 or more different physical characteristics or pre-curing compositions may be stacked to form this member for transducers. Moreover, the function of the thin film-like silicone elastomer layer may be a dielectric layer or an electrode layer. In particular, in a preferred member for a transducer, thickness of the dielectric layer is 1 to 1,000 µm, and thickness of the electrode layer is 0.05 µm to 100 µm.

The transducer of the present invention is characterized as having this member for transducers produced by curing of the curable organopolysiloxane composition for transducers of the present invention, and the transducer of the present invention may have a structure that particularly comprises a highly stacked layer structure (i.e. 2 or more dielectric layers). The transducer of the present invention further may have a structure that comprises 3 or more dielectric layers. The transducer that has this type of highly stacked structure is able to generate greater force by comprising multiple layers. Moreover, by stacking of layers, it is possible to obtain greater displacement than would be obtained by using a single layer.

An electrode may be comprised at both ends of the dielectric layer for transducers of the present invention. The utilized electrode substance is exemplified by metals and alloys of metals such as gold, platinum, silver, palladium, copper, nickel, aluminum, titanium, zinc, zirconium, iron, cobalt, tin, lead, indium, chromium, molybdenum, manganese, or the like; metal oxides such as indium-tin compound oxide (ITO), antimony-tin compound oxide (ATO), ruthenium oxide, titanium oxide, zinc oxide, tin oxide, and the like; carbon materials such as carbon nanotubes, carbon nano-horns, carbon nanosheets, carbon fibers, carbon black, or the like; and electrically conductive resins such as poly(ethylene-3,4-dioxythiophene) (PEDOT), polyaniline, polypyrrole, or the like. Electrically conductive elastomers and electrically conductive resin having electrically conductive fillers dispersed in the resin can be used.

The electrode may comprise one substance alone from among the aforementioned electrically conductive substances, or may comprise 2 or more such electrically conductive substances. If the electrode comprises 2 or more types of electrically conductive substances, one of the electrically conductive substances may function as the active substance, and the remaining electrically conductive substances may function as conductive materials for lowering resistance of the electrode.

The total thickness of the dielectric layer for transducers of the present invention may be set in the range of 10 µm to 2,000 µm (2 mm), although this total thickness may be particularly set to a value greater than or equal to 200 µm. In particular, thickness per single layer of the dielectric silicone elastomer layer forming the dielectric layer is preferably 0.1 to 500 µm, and this thickness is particularly preferably 0.1 to 200 µm. By stacking 2 or more layers of these thin silicone elastomer layers, it is possible to improve characteristics such as insulation breakdown voltage, dielectric constant, and displacement amount in comparison to the use of a single layer.

The term "transducer" in the present invention is taken to mean an element, machine, or device for conversion of a certain type of energy to a separate type of energy. This transducer is exemplified by artificial muscles and actuators for conversion of electrical energy into mechanical energy; sensors and electricity generating elements for conversion of mechanical energy into electrical energy; speakers, microphones, and headphones for conversion of electrical energy into sound energy; fuel cells for conversion of chemical energy into electrical energy; and light emitting diodes for conversion of electrical energy into light energy.

The transducer of the present invention is capable of use particularly as an artificial muscle, actuator, sensor, or electrical generating element due to the dielectric and mechanical characteristics of the transducer of the present invention. An artificial muscle is anticipated to be used for applications such as robots, nursing equipment, rehabilitation training equipment, or the like. An embodiment as an actuator will be explained below as an example of the present invention.

[FIGS. 1 to 4]

FIG. 1 shows a cross sectional view of an actuator 1 of the present embodiment in which dielectric layers are stacked. In this embodiment, the dielectric layer is composed of 2 dielectric layers, for example. The actuator 1 is equipped with dielectric layers 10a and 10b, electrode layers 11a and 11b, a wire 12, and an electrical power source 13. The electrode layers 11a and 11b cover a respective contacting surface of the dielectric layer, and these are connected to the electrical power source 13 through respective wires 12.

The actuator 1 may be driven by application of a voltage between the electrode layer 11 and the electrode layer 11b. By application of voltage, the dielectric layers 10a and 10b become thinner due to dielectric properties, and this results in elongation parallel to the faces of the electrode layers 11a and 11b. That is to say, it is possible to convert electrical energy into force or mechanical energy of movement or displacement.

Figure 2:
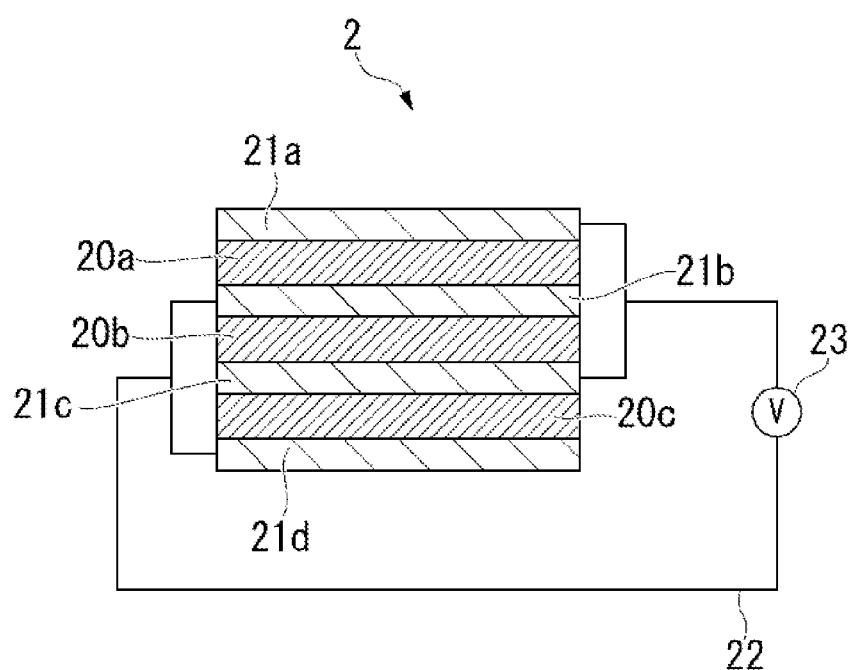

FIG. 2 shows a cross sectional view of an actuator 2 of the present embodiment in which the dielectric layer and electrode layer are stacked. According to the present embodiment, the dielectric layer is composed of 3 layers, and the electrode layer is composed of 4 layers, for example. The actuator 2 is equipped with dielectric layers 20a, 20b, and 20c, electrode layers 21a, 21b, 21c and 21d; the wire 22; and the electrical power source 23. The electrode layers 21a, 21b, 21c, and 21d each cover a respective contacting surface of dielectric layer, and these are connected to the electrical power source 23 through respective wires 22. The electrode layers are connected alternatingly to sides of different voltage, and the electrode layers 21a and 21c are connected to a different side from that of the electrode layers 2b and 21d.

By application of voltage between the electrode layer 21a and electrode layer 21b, application of voltage between the electrode layer 21b and electrode layer 21c, and application of voltage between the electrode layer 21c and electrode layer 21d, it is possible to drive the actuator 2. By application of voltage, the dielectric layers 20a, 20b, and 20c become thinner due to dielectric properties, and this results in elongation parallel to the faces of the electrode layers 21a, 21b, 21c, and 21d. That is to say, it is possible to convert electrical energy into force or mechanical energy of movement or displacement.

Although the embodiment of an actuator was described as an example of the transducer of the present invention, when mechanical energy (such as pressure or the like) is applied from outside to the transducer of the present invention, it is possible to generate an electrical potential difference as electrical energy between the mutually insulated electrode layers. That is to say, use is possible as a sensor for the conversion of mechanical energy into electrical energy. This embodiment of a sensor will be described below.

Figure 3:
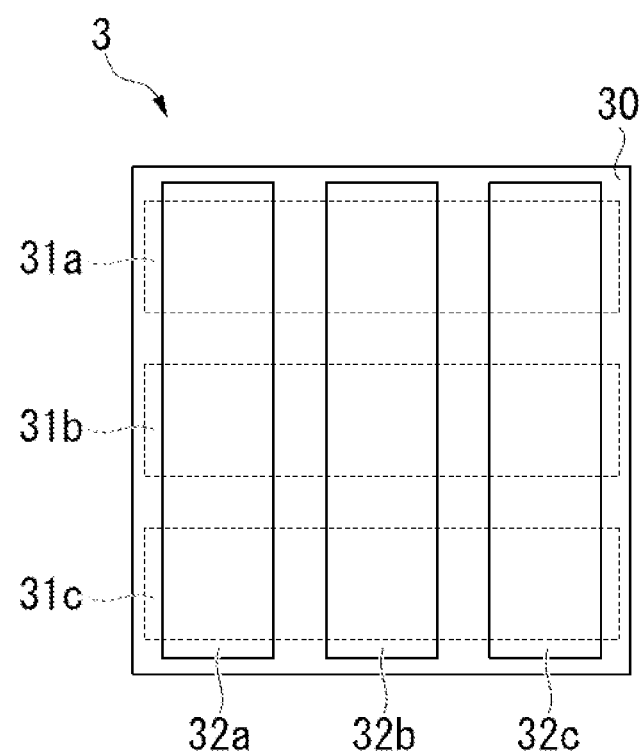

FIG. 3 shows structure of the sensor 3 of the present embodiment. The sensor 3 has a structure in which the dielectric layer 30 is disposed between upper electrode layers 31a, 31b, and 31c and lower electrode layers 32a, 32b, and 32c arranged in a matrix-like pattern. According to the present embodiment, for example, the electrode layers are disposed in a matrix pattern of 3 rows in the vertical direction and horizontal direction, respectively. The face of each electrode layer not contacting the dielectric layer 30 may be protected by an insulating layer. Moreover, the dielectric layer 30 may comprise 2 or more layers of the same dielectric layer containing organopolysiloxane.

When an external force is applied to the surface of this sensor 3, the thickness of the dielectric layer 30 between the upper electrode layer and the lower electrode layer changes at the pressed location, and there is a change in static capacitance between the electrode layers due to this change. By measurement of the electrical potential difference between the electrode layers due to this change of static capacitance between these electrode layers, it is possible to detect the external force. That is to say, this embodiment may be used as a sensor for conversion of mechanical energy into electrical energy.

Furthermore, although the opposing electrode layers sandwiching the dielectric layer were formed as 3 pairs in the sensor 3 of the present embodiment, the number, sizes, placement, or the like of electrodes may be selected appropriate according to application.

An electricity generating element is a transducer for conversion of mechanical energy into electrical energy. This electricity generating element may be used for devices that generate electricity, beginning with electricity generation by natural energy such as wave power, water power, water power, or the like, as well as generation of electricity due to vibration, impact, pressure change, or the like. An embodiment of this electricity generating element will be described below.

Figure 4:
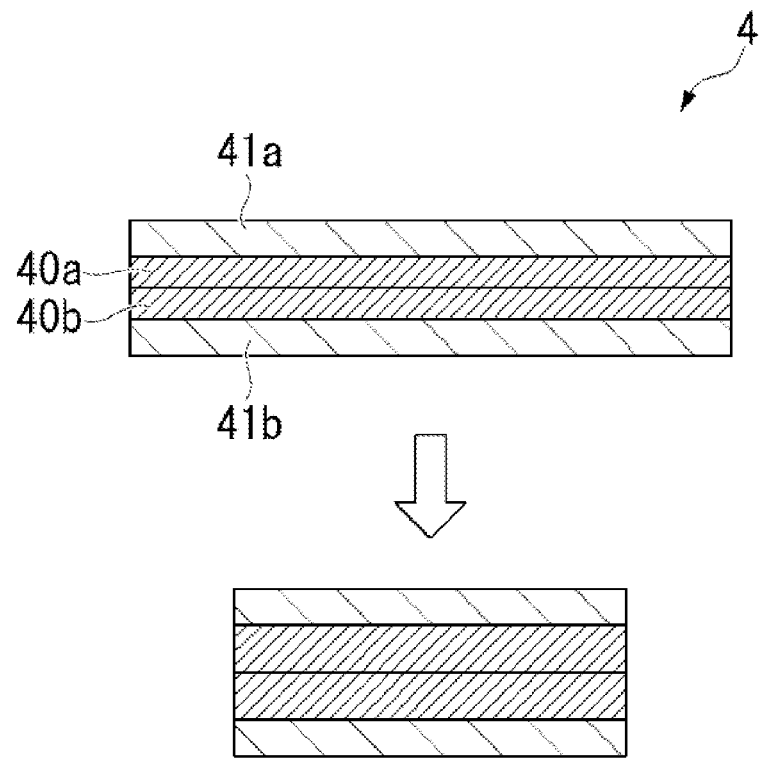

FIG. 4 shows a cross sectional view of the electricity generating element 4 of the present embodiment, in which dielectric layers are stacked. In this embodiment, the dielectric layer is composed of 2 dielectric layers, for example. The electricity generating element 4 is composed of the dielectric layers 40a and 40b and the electrode layers 41a and 41b. The electrode layers 41a and 41b are arranged covering one face of the respective contacted dielectric layer.

The electrode layers 41a and 41b are connected electrically to a non-illustrated load. This electricity generating element 4 may generate electrical energy by change of the static capacitance by change of the distance between the electrode layers 41a and 41b. That is to say, due to change in the shape of the element between the electrode layers 41a and 41b in the electrostatic charge-induced state due to electrostatic field formed by the dielectric layers 40a and 40b, the charge distribution becomes biased, the static capacitance between electrode layer changes due to such bias, and an electrical potential difference arises between the electrode layers.

In the present embodiment, due to change from a state (upper drawing) of applied compression force in the direction parallel to the faces of the electrode layers 41a and 41b of the electricity generating element 4 shown in FIG. 4 to a state (lower drawing) of non application of compression as shown in the same figure, an electrical potential difference arises between the electrode layers 41a and 41b, and it is possible to realize the function of an electricity generating element by output of this change of electrical potential difference as electrical power. That is to say, it is possible to convert mechanical energy into electrical energy. Moreover, multiple elements may be arranged on a substrate, and it is possible to construct an electricity generating device that generates a greater amount of electricity by series or parallel connection of such multiple elements.

The transducer of the present invention may operate in air, water, vacuum, or organic solvent. Moreover, the transducer of the present invention may be sealed appropriately according to the environment of use of the transducer. No particular limitation is placed on the sealing method, and this sealing method is exemplified by sealing using a resin material or the like.

INDUSTRIAL APPLICABILITY

The curable organopolysiloxane composition for transducers of the present invention may be used appropriately for the manufacture of a transducer. The curable organopolysiloxane composition for transducers of the present invention, rather than simply an uncured curable composition, may comprise a so-called B stage material in a state in which the reactive organopolysiloxane is partially reacted, and curing is incomplete. A B stage material of the present invention is exemplified by a material in a state that is gel-like or has flowability. Therefore the embodiments of the present invention also comprise a member in a state where the curing reaction of the curable organopolysiloxane composition for transducers has partially progressed, and in which the member for transducers is in a state that is gel-like or fluid. Moreover, the member for transducers in this type of semi-cured state may be composed of a single layer or stacked layers of the thin film-like silicone elastomer.

EXAMPLES

In order to embody the present invention, practical examples will now be given. However, it should be understood that these practical examples do not limit the scope of the present invention. Furthermore, "%" below represents percent by weight.

Practical Example 1

Poly-trifluoropropyl, methylsiloxane ($A_{21}$) (0.14% vinyl content) having a viscosity of 50,000 mPa·s at 25° C. and capped by dimethylvinylsiloxy groups at both terminals, spherical barium titanate of 1.0 μm average particle diameter (produced by Fuji Titanium Industry Co., Ltd., HPBT-1B), as well as tetramethyltetravinylcyclotetrasiloxane as a reaction control agent were mixed by a rotation orbital mixer at the rate of 2000 rpm for 30 seconds. Then, in accordance with the formulation ratio shown in table 1, tris(dimethylhydrogensiloxy)trifluoropropylsilane ($A_{11}$, SiH content=0.55%) were added and mixed at the rate of 2000 rpm for 30 seconds. Furthermore, 0.67% (as platinum) of the platinum complex of 1,3-diethenyl-1,1,3,3-tetramethyldisiloxane complex dissolved in dimethylvinylsiloxy group doubly terminated methylpolysiloxane were added and mixed at the rate of 2000 rpm for 15 seconds to obtain a silicone elastomer composition. Here, the molar ratio of all SiH functional groups over all vinyl groups in this silicone elastomer composition (SiH groups/vinyl groups) was 1.3.

Here when the reactive organopolysiloxane is represented by $M_a M^R_b D_c D^R_d T_e T^R_f Q_g$, the weight fraction (X) of the organopolysiloxane having a value of $(a+c)/(b+d+e+f+g)$ is less than 3 relative to the entire siloxane component in the curable organopolysiloxane composition (i.e. X=1.7%). The weight fraction (Y) of the doubly molecular chain terminated reactive organopolysiloxane relative to the entire amount of siloxane component in the curable organopolysiloxane composition is 98.3%. The blend ratio (weight ratio S/L) of the reactive organopolysiloxane (S) having at least 2 curing reaction-capable groups in a single molecule and having an average molecular weight between 2 groups capable of curing reaction less than 10,000 to the reactive organopolysiloxane (L) having at least 2 curing reaction-capable groups in a single molecule and having an average molecular weight between 2 groups capable of curing reaction greater than or equal to 10,000 and less than or equal to 150,000 is 1.7/98.3. On the other hand, based on the chemical structure of the aforementioned polyorganosiloxane raw material, the content of the silicon-bonded hydrogen atoms, the content of alkenyl groups, and the number average molecular weight, the number of crosslink points per unit weight (J value) was calculated to be 21.0 µmol/g, and the molecular weight between crosslink points (K value) was calculated to be about 220,000.

This silicone elastomer composition was press cured for 15 minutes at 190° C., and then was post-cured in an oven for 60 minutes at 190° C. Based on JIS K 6249, Young's modulus, tensile strength, elongation at break, and tear strength were measured for the obtained cured article. In order to measure mechanical strength, a sheet of 2 mm thickness was made. Durometer A hardness of a 6 mm thick sheet was measured based on JIS K 6253.

Moreover, this silicone elastomer composition was press cured for 15 minutes at 190° C. to produce a 0.07 mm thick sheet, and insulation breakdown strength as measured using an electrical insulation breakdown voltage oil tester, i.e. PORTATEST 100A-2 manufactured by Soken Electric Co., Ltd. In the same manner, the silicon elastomer composition was press cured for 15 minutes at 190° C. for 15 minutes to produce a sheet of 1 mm thickness. Specific dielectric constant was measured under 23° C. temperature and 1 MHz measurement frequency conditions using a TR-1100 dielectric constant-tangent measurement device manufactured by Ando Electric Co., Ltd. The results are shown in Table 1.

Practical Examples 2 to 8 and Comparative Examples 1 to 3

The same procedure as that of Practical Example 1 was performed except for changing the added amounts and chemical structures of the crosslinking agent $A_1$ and the polymer $A_2$, or as may have been required, using the fine particles listed in Table 1, to obtain silicone rubber compositions. Herein, in practical example 2, all components except for the component of the platinum complex of 1,3-diethenyl-1,1,3,3-tetramethyldisiloxane complex are added at once and mixed.

The aforementioned X, Y, S/L, J, and K values were calculated in the same manner. The obtained composition was heated and cured in the same manner, and mechanical strength and electrical characteristics were evaluated. These results are shown in Table 1. Furthermore, in practical example 7, in advance, the surface of fine particle of barium titanate was treated with phospholic acid having pentafluorophenyl group in the amount equal to three times as much as necessary amount covering the entire surface thereof at 78° C. in the solvent mixture of ethanol and water at the volume ratio of 95:5. Then, excessive part of surface treating agent was washed off with the aforementioned ethanol aqueous solution. The obtained fine particle was further treated at 85° C. under vacuum to provide surface-treated fine particle.

Moreover, in the table, the chemical structures of the crosslinking agents and polymers not described above are as follows.

$A_{21}$: Poly-trifluoropropyl, methylsiloxane having a viscosity of 2,000 mPa·s at 25° C. and capped by dimethylvinylsiloxy groups at both terminals $A_{22}$: Poly-trifluoropropyl, methylsiloxane-dimethylsiloxane copolymer capped by dimethylvinylsiloxy groups at both terminals $A_{23}$: Poly-cyanopropyl, methylsiloxane-dimethylsiloxane copolymer capped by dimethylvinylsiloxy groups at both terminals $A_{24}$, $A_{25}$, $A_{26}$: Polydimethylsiloxane capped by dimethylvinylsiloxy groups at both terminals $A_{11}$: tris(dimethylhydrogensiloxy)trifluoropropylsilane $A_{12}$: tris(dimethylhydrogensiloxy) cyanoethylsilane $A_{13}$: Trimethylsilyl doubly terminated dimethylmethylhydrogensiloxane copolymer $A_{14}$: Dimethylhydrogen functionalized MQ resin (F) Reaction control agent: tetramethyltetravinylcyclotetrasiloxane (C) Pt catalyst: platinum 1,3-divinyl-1,1,3,3-tetramethyldisiloxane complex Electromechanical Testing of the Cured Silicone Elastomer Thin Film Practical Example 1 v. Comparative Example 4

A cured thin film based on the present invention (Example #1) underwent coating, applied by brush, with an electrode paste composed of carbon black and silicone oil ([Asbury conductive carbon grade 5303]/[Dow Corning FS1265 Fluosilicone Oil]=1/7 (w/w)). The diameter of the electrode application (circle), that defines the active EAP area, ranged from 10 mm to 20 mm. Electromechanical testing was conducted to analyze the relationship between electric field and thickness strain using a Dow Corning electro-mechanical tester constructed by SRI international Inc. The measurement conditions are as follows.

1) Temp & Humidity: at 21-23° C. & relative humidity 35-52

2) Initial film thickness: 105 um

3) Biaxial pre-stretch: 25%

4) Film thickness after biaxial stretch: 67 um

5) Voltage pattern was 0.5 Hz square wave type. Changes in electrode circle diameter at '0' volts versus test voltage condition define actuation radial strain. Thickness strain is related to radial strain due to incompressibility of the silicone samples. Electric field is defined as the test voltage divided by the 'final' film thickness (film thickness after re-stretch and actuation)

Figure 5:
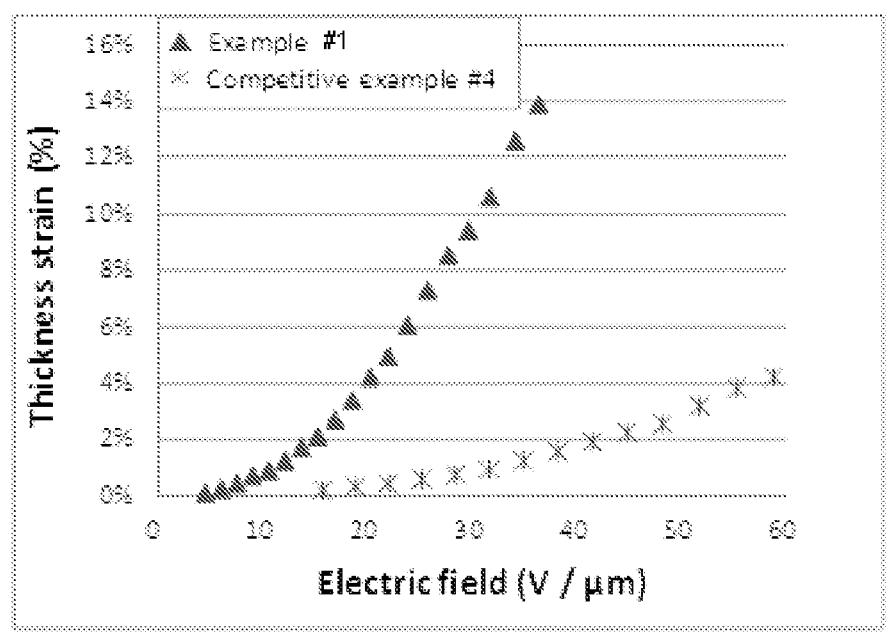

The thickness strain (%) as a function of electric field (V/um) is depicted in FIG. 5 along with that for Sylgard 186 as a control material (Comparative example #4).

FIG. 5. The thickness strain (%) as a function of electric field (V/um) for Example #1 and comparative example #4.

TABLE 1

(Compositions of Practical Examples 1 to 8)

| | Examples | 1 | 2 | 3 | 4 | 5 | 6 | 7 | 8 |
|---|---|---|---|---|---|---|---|---|---|
| straight chain polymer | Reactive functional group: content (wt %) | | | | | | | | |
| A21(dielectric) | Vinyl group: 0.14 | 53.98 | 98.23 | 72.63 | 89.80 | 33.76 | | 53.98 | |
| A22(dielectric) | Vinyl group: 0.13 | | | | | | 52.54 | | |
| A23(dielectric) | Vinyl group: 0.20 | | | | | | | | 51.82 |
| A24 | Vinyl group: 0.14 | | | | | | | | |
| A25 | Vinyl group: 0.95 | | | | | | | | |
| A26 | Vinyl group: 0.23 | | | | | | | | |
| Cross-linker | | | | | | | | | |
| A11(dielectric) | Si—H group: 0.55 | 0.88 | 1.38 | 1.18 | 1.46 | 0.55 | 0.82 | 0.88 | |
| A12(dielectric) | Si—H group: 0.74 | | | | | | | | 0.84 |
| A13 | Si—H group: 0.75 | | | | | | | | |
| A14 | Si—H group: 0.83 | | | | | | | | |
| (F) reaction control agent | | 0.07 | 0.17 | 0.09 | 0.11 | 0.04 | 0.07 | 0.07 | 0.06 |
| (C) Pt catalyst | | 0.08 | 0.22 | 0.11 | 0.13 | 0.05 | 0.08 | 0.08 | 0.08 |
| inorganic fine particles | Specific surface area (m2/g) | | | | | | | | |
| (D) silicone surface-treated barium titanate | 2.2 | 45.00 | — | 26.00 | 8.50 | 65.60 | 46.50 | 45.00 | 47.20 |
| Total (mass %) | | 100 | 100 | 100 | 100 | 100 | 100 | 100 | 100 |

(Compositions of Comprative Examples 1 to 8)

| | Comparative Examples | 1 | 2 | 3 |
|---|---|---|---|---|
| straight chain polymer | Reactive functional group: content (wt %) | | | |
| A21(dielectric) | Vinyl group: 0.14 | | | |
| A22(dielectric) | Vinyl group: 0.13 | | | |
| A23(dielectric) | Vinyl group: 0.20 | | | |
| A24 | Vinyl group: 0.14 | 49.42 | 69.18 | |
| A25 | Vinyl group: 0.95 | | | 4.60 |
| A26 | Vinyl group: 0.23 | | | 63.82 |
| Cross-linker | | | | |
| A11(dielectric) | Si—H group: 0.55 | | | |
| A12(dielectric) | Si—H group: 0.74 | | | |
| A13 | Si—H group: 0.75 | | | 1.20 |
| A14 | Si—H group: 0.83 | 0.45 | 0.63 | |
| (F) reaction control agent | | 0.06 | 0.09 | 0.04 |
| (C) Pt catalyst | | 0.07 | 0.10 | 0.04 |
| inorganic fine particles | Specific surface area (m2/g) | | | |
| (D) silicone surface-treated barium titanate | 2.2 | 50.00 | 30.00 | — |
| silica | 209 | | | 30.30 |
| Total (mass %) | | 100 | 100 | 100 |

Compositions, Structural Factors, and Physical Property Values of Practical Examples 1 to 7

| | Examples | 1 | 2 | 3 | 4 | 5 | 6 | 7 |
|---|---|---|---|---|---|---|---|---|
| composition and structural factors | X value | 1.5% | 1.7% | 1.7% | 1.7% | 1.7% | 1.6% | 1.7% |
| | Y value | 98.5% | 98.3% | 98.3% | 98.3% | 98.3% | 98.4% | 98.3% |
| | S component fraction | 1.5% | 1.7% | 1.7% | 1.7% | 1.7% | 1.6% | 1.7% |
| | L component fraction | 98.5% | 98.3% | 98.3% | 98.3% | 98.3% | 98.4% | 98.3% |
| | J value | 21.0 | 21.0 | 21.0 | 21.0 | 21.0 | 20.0 | 22.6 |
| | K value | 22076 | 22076 | 22076 | 22076 | 22076 | 17056 | 21604 |
| physical property value | unit | | | | | | | |
| hardness | Shore A | 11.5 | 27.2 | 19.9 | 15.9 | 38.1 | 20.8 | 26.6 |
| tensile strength | MPa | 0.31 | 0.99 | 0.66 | 0.39 | 1.26 | 1.11 | 0.77 |
| elongation at break | % | 221% | 201% | 207% | 191% | 178% | 317% | 204% |

TABLE 1-continued

| | | | | | | | | |
|---|---|---|---|---|---|---|---|---|
| tearing strength | N/mm | 0.91 | 2 | 1.5 | 1.29 | 3.9 | 1.37 | 1.92 |
| Young's modulus | MPa | 0.18 | 0.57 | 0.45 | 0.37 | 1.15 | 0.45 | 0.61 |
| dielectric breakdown strength | V/um | 28.9 | 33.6 | 34.8 | 34.1 | 35.3 | 36.0 | 34.4 |
| specific dielectric constant | | 6.9 | 13.4 | 9.1 | 7.2 | 21.4 | 9.1 | 13.0 |

Compositions, Structural Factors, and Physical Property Values of Practical Examples 8, Compratiave Examples 1 to 3

| | | | Comparative Examples | | |
|---|---|---|---|---|---|
| Examples | | 8 | 1 | 2 | 3 |
| composition and structural factors | X value | 1.7% | 1.0% | 1.0% | 1.8% |
| | Y value | 98.3% | 99.0% | 99.0% | 98.2% |
| | S component fraction | 1.7% | 1.0% | 1.0% | 8.4% |
| | L component fraction | 98.3% | 99.0% | 99.0% | 91.6% |
| | J value | 22.6 | 21.3 | 21.3 | 37.9 |
| | K value | 21604 | 14972 | 14972 | 30685 |
| physical property value | unit | | | | |
| hardness | Shore A | 8.8 | 21.3 | 19.5 | 34 |
| tensile strength | MPa | 5.515 | 1.1 | 0.7 | 7.8 |
| elongation at break | % | 310% | 221% | 224% | 481 |
| tearing strength | N/mm | 1.15 | 1.67 | 1.33 | 15.5 |
| Young's modulus | MPa | 0.27 | 0.55 | 0.47 | 0.7 |
| dielectric breakdown strength | V/um | 25.3 | 41.0 | 46.8 | 57.5 |
| specific dielectric constant | | 10.7 | 4.5 | 3.2 | 2.8 |

As shown in Table 1, the curable organopolysiloxane composition of the present invention had the component of compound having a highly dielectric functional group, and thus a silicone elastomer was provided that had excellent mechanical characteristics (as represented by elongation at break) and dielectric characteristics (as represented by the dielectric constant). Moreover, by optimization of the crosslinking structure and the inorganic fine particles, it is possible to design a material according to the desired transducer application.

In particular, as shown in FIG. 5, the silicone elastomer obtained from the curable organopolysiloxane composition of the present invention attains high dielectric properties even in the low voltage region.

On the other hand, the silicone elastomer obtained from the curable organopolysiloxane composition that did not have an optimized crosslinking structure had a high Young's modulus, and elongation at break was low. Thus this silicone elastomer is unsuitable as a material for use in a transducer.

REFERENCE NUMERALS 1, 2 . . . actuator
10a, 10b, 20a, 20b, 20c . . . dielectric layer
11a, 11b, 21a, 21b, 21c, 21d . . . electrode layer (electrically conductive layer)
12, 22 . . . wire
13, 23 . . . electrical power source
3 . . . sensor
30 . . . dielectric layer
31a, 31b, 31c . . . upper electrode layer
32a, 32b, 32c . . . lower electrode layer
4 . . . electricity generating element
40a, 40b . . . dielectric layer
41a, 41b . . . electrode layer

What is claimed is:

1. A member for a transducer, the member being formed by at least partial curing of a curable composition comprising:
a curable organopolysiloxane composition (A+B) and
a compound having a highly dielectric functional group, such compound selected from the group consisting of a silicon compound (Z), an organic compound (Z1) having at least one curable functional group, and an organic compound (Z2) miscible with the composition (A+B),
further optionally comprising one or more of
(E) at least one type of inorganic particle selected from the group consisting of electrically conductive inorganic particles, insulating inorganic particles, and reinforcing inorganic particles; and
(F) an additive for improvement of mold releasability or insulation breakdown characteristics.

2. The member according to claim 1, wherein the curable composition is curable by condensation curing reaction, addition curing reaction, peroxide curing reaction, photo-curing reaction or drying with solvent removal.

3. The member according to claim 1, wherein the curable composition cure to provide a structure wherein the highly dielectric functional group is bonded to silicon atom via a covalent bond.

4. The member according to claim 1, wherein the content of the highly dielectric functional group is in a range of 1 to 80 mass % to the entire siloxane component of the curable composition.

5. The member according to claim 1, wherein the highly dielectric functional group is at least one selected from a) Halogen Atoms, a1) Halogen Atom-containing Groups, b) Nitrogen Atom-containing Groups, c) Oxygen Atom-containing Groups, d) Heterocyclic Groups, e) Boron-containing Groups, f) Phosphorous-containing Groups, and g) Sulfur-containing Groups.

6. The member according to claim 1, wherein at least one part of main chain of curable organopolysiloxane includes at least one selected from Boron atom and Phosphorous atom.

7. The member according to claim 1, wherein
the curable composition comprises the curable organopolysiloxane composition (A+B) comprising a) a reactive organopolysiloxane represented by general formula $M_a M^R_b D_c D^R_d T_e T^R_f Q_g$, wherein $(a+c)/(b+d+e+f+g)$ is less than or equal to 3, R represents a reactive group capable of condensation reaction, addition reaction, peroxide reaction, or photoreaction, in an amount range greater than or equal to 0.1% by weight and less than or equal to 25% by weight, relative to the entire organopolysiloxane component in the curable composition;
b) a reactive organopolysiloxane having only at each molecular terminal a group capable of condensation reaction, addition reaction, peroxide reaction, or photoreaction, in an amount greater than or equal to 75% by weight and less than or equal to 99.9% by weight, relative to a total siloxane component in the curable composition
a reactive organopolysiloxane (S)
having in a single molecule at least two groups capable of reacting with each other through condensation reaction, addition reaction, peroxide reaction, or photoreaction to cure the curable composition, wherein the average molecular weight between the 2 groups capable of the curing reaction is less than 10,000; and
d), a reactive organopolysiloxane (L) having in a single molecule at least two groups capable of reacting with each other through a condensation reaction, addition reaction, peroxide reaction, or photoreaction to cure the curable composition, wherein the average molecular weight between the 2 groups capable of the curing reaction is greater than or equal to 10,000 and less than or equal to 150,000; and the weight ratio of the component (S) to the component (L) being in the range of 1:99 to 40:60; and further comprising
(C) a curing agent; and
(D) dielectric inorganic fine particles having a specific dielectric constant at 1 kHz of greater than or equal to 10, at room temperature.

8. The member according to claim 2, wherein the curing reaction is addition reaction.

9. The member according to claim 2, wherein the curing reaction is a hydrosilylation reaction.

10. The member according to claim 1, wherein the ratio of the silicon-bonded hydrogen atoms to silicon-bonded unsaturated hydrocarbon groups in the curable composition is in a range of 0.5:1.0 to 3.0:1.0.

11. The member according to claim 1, wherein the curable organopolysiloxane composition (A+B) comprises:
(A) an organohydrogenpolysiloxane comprising one or multiple components, represented by general formula $M_{ai} M^H_{bi} D_{ci} D^H_{di} T_{ei} T^H_{fi} Q_{gi}$, having a number average molecular weight (Mw) in a range of 300 to 15,000, and having at least 2 silicon-bonded hydrogen atoms on average in a single molecule; and (B) an organopolysiloxane comprising one or multiple components, represented by general formula $M_{aj} M^{Vi}_{bj} D_{cj} D^{Vi}_{dj} T_{ej} T^{Vi}_{fj} Q_{gj}$, having a number average molecular weight (Mw) in a range of 300 to 100,000, and having at least 2 alkenyl groups on average in a single molecule;

wherein bonded hydrogen atom; $M^{Vi}$, $D^{Vi}$, and $T^{Vi}$ are each a siloxane unit in which one of the R groups of the siloxane units represented by M, D, and T, respectively, is replaced by an alkenyl group of 2 to 20 carbon atoms;

a, b, c, d, e, f, and g is each an average number per single molecule;

i represents an i-th component in the component (A);

j represents a j-th component in the component (B);

and the organopolysiloxane composition (A+B), after curing, contains a crosslinking point count per unit weight in a range of 0.5 to 20 µmol/g, such crosslinking point per unit weight calculated by the following formula:

$$\text{(Number of cross link points per unit weight)} = \frac{\text{(The index of number of cross link points of the reaction composition)}}{\text{(The index of raw material mole count in the reaction composition)} \times \text{(The index of molecular weight of the reaction composition)}}$$

in which:
(i)

$$\text{(The index of probability of inter terminal group reaction)} = \left( \frac{\sum_{i=1}^{p} \frac{\alpha_i}{Mw_i} b_i}{\sum_{i=1}^{p} \frac{\alpha_i}{Mw_i}(b_i + d_i + f_i)} \right) \times \left( \frac{\sum_{j=1}^{r} \frac{\beta_j}{Mw_j} b_j}{\sum_{j=1}^{r} \frac{\beta_j}{Mw_j}(b_j + d_j + f_j)} \right);$$

$$\text{(The index of number of cross link points of the reaction composition)} = \frac{1}{2} \times \left( \sum_{i=1}^{p} \frac{\alpha_i}{Mw_i}(b_i + d_i) + \sum_{j=1}^{r} \frac{\beta_j}{Mw_j}(b_j + d_j) \right) +$$

$$\sum_{i=1}^{p} \frac{\alpha_i}{Mw_i}(e_i + f_i + g_i) + \sum_{j=1}^{r} \frac{\beta_j}{Mw_j}(e_j + f_j + g_j) -$$

$$\frac{1}{2} \times \text{(The index of probability of inter terminal group reaction)} \times$$

$$\left( \sum_{i=1}^{p} \frac{\alpha_i}{Mw_i}(b_i + d_i + f_i) + \sum_{j=1}^{r} \frac{\beta_j}{Mw_j}(b_j + d_j + f_j) \right).$$

provided that, in a calculation of the index of number of crosslink points of the reaction composition, a component for which a value of $(a+c)/(b+d+e+f+g)$ representing average number of organosiloxane units between reactive groups in a molecular chain is less than 3, is taken to act as a single crosslink point, and calculation for such a component assumes (b+d)=0 and (e+f+g)=1;

(ii)

$$(\text{The index of raw material mole count in the reaction composition}) = \sum_{i=1}^{p} \frac{\alpha_i}{Mw_i} + \sum_{j=1}^{r} \frac{\beta_j}{Mw_j}$$

$$(\text{The index of molecular weight in the reaction composition}) = \left(\frac{\sum_{i=1}^{p} \alpha_i Mw_i}{\sum_{i=1}^{p} \alpha_i}\right) + \left(\frac{\sum_{j=1}^{r} \beta_j Mw_j}{\sum_{j=1}^{r} \beta_j}\right)$$

where, in each of the formulae,
$\alpha_i = \alpha^w_i/\gamma$, wherein $\alpha^w_i$ is the amount by weight of the i-th component of the component (A) $\gamma=$(moles of silicon-bonded hydrogen atoms (H) included in the component (A))/(moles of alkenyl groups (V) included in the component (B));
$\beta_j$ is the amount by weight of the j-th component of the component (B);
$M_{wi}$ is the number average molecular weight of the i-th component of the component (A); and
$M_{wj}$ is the number average molecular weight of the j-th component of the component (B).

12. The member for a transducer according to claim 1, wherein the molecular weight between crosslink points of the reactive polysiloxane after the curing reaction is in a range of 100,000 to 2,000,000, where (Molecular weight between cross link points) =

$$\frac{(\text{The index of molecular weight of the reaction composition}) \times (\text{The index of raw material mole count in the reaction composition})}{(\text{The index of organosiloxane chain count of the reaction composition})};$$

wherein (The index of probability of inter terminal group reaction) =

$$\left(\frac{\sum_{i=1}^{p} \frac{\alpha_i}{Mw_i} b_i}{\sum_{i=1}^{p} \frac{\alpha_i}{Mw_i}(b_i + d_i + f_i)}\right) \times \left(\frac{\sum_{j=1}^{r} \frac{\beta_j}{Mw_j} b_j}{\sum_{j=1}^{r} \frac{\beta_j}{Mw_j}(b_j + d_j + f_j)}\right);$$

(The index of organosiloxane chain count of the reaction composition) $= \sum_{i=1}^{p} \left(\frac{\alpha_i}{Mw_i}(d_i + 2e_i + 2f_i + 3g_i + 1)\right) +$ $$\sum_{j=1}^{r} \left(\frac{\beta_j}{Mw_j}(d_j + 2e_j + 2f_j + 3g_j + 1)\right) -$$

$$\frac{1}{2} \times (\text{The index of probability of inter terminal group reaction}) \times$$

$$\left(\sum_{i=1}^{p} \frac{\alpha_i}{Mw_i}(b_i + d_i + f_i) + \sum_{j=1}^{r} \frac{\beta_j}{Mw_j}(b_j + d_j + f_j)\right);$$

provided that, in the calculation of the index of number of crosslink points of the reaction composition, a component for which the value of (a+c)/(b+d+e+f+g) representing average number of organosiloxane units between reactive groups in the molecular chain is less than 3 is taken to act as a single crosslink point, and calculation for such a component assumes (d+2e+2f+3g+1)=0;

(The index of raw material mole count in the reaction composition) $= \sum_{i=1}^{p} \frac{\alpha_i}{Mw_i} + \sum_{j=1}^{r} \frac{\beta_j}{Mw_j}$;

and (The index of molecular weight in the reaction composition) =

$$\left(\frac{\sum_{i=1}^{p} \alpha_i Mw_i}{\sum_{i=1}^{p} \alpha_i}\right) + \left(\frac{\sum_{j=1}^{r} \beta_j Mw_j}{\sum_{j=1}^{r} \beta_j}\right),$$

the terms as defined above.

13. The member according to claim 1,
wherein the curable organopolysiloxane composition (A+B) comprises:
(A1) at least one type of organohydrogenpolysiloxane having silicon atom-bonded hydrogen atoms at both molecular terminals, a weight fraction of hydrogen atoms being 0.1 to 1.0% by weight;
(A2) at least one type of organohydrogenpolysiloxane having at least 3 silicon atom-bonded hydrogen atoms in a single molecule, a weight fraction of hydrogen atoms being 0.03 to 2.0% by weight; and
(B) at least one type of organopolysiloxane having at least 2 alkenyl groups in a single molecule, a weight fraction of the alkenyl groups being 0.05 to 0.5% by weight; and further comprising
a hydrosilylation reaction catalyst; and
(D) dielectric inorganic fine particles having a specific dielectric constant at 1 kHz greater than or equal to 10 at room temperature.

14. The member according to claim 7, wherein the dielectric inorganic fine particles (D) are one or more types of inorganic fine particles selected from the group consisting of titanium oxide, barium titanate, strontium titanate, lead titanate zirconate, and barium titanate, and composite metal oxides in which the barium and titanium positions of barium titanate are partially replaced by an alkaline earth metal.

15. The member according to claim 14, wherein a part or the entire amount of the components (D) and (E) is surface treated by one or more types of surface treatment agent.

16. A method for production of the curable organopolysiloxane composition for manufacturing the member according to claim 1, the method comprising a step of blending at least two components constituting the curable organopolysiloxane composition using at least one mechanical means selected from the group consisting of twin screw extruders, twin screw kneaders, and single screw blade-type extruders.

17. The member according to claim 1, wherein the member is a silicone elastomer intermediate layer.

18. A transducer comprising:
a pair of electrodes;
the silicone elastomer intermediate layer of claim 17 disposed between the electrodes.

19. The transducer of claim 18 having two or more silicone elastomer intermediate layers, wherein at least two of the silicone elastomer intermediate layers are stacked.

* * * * *